United States Patent [19]
Tateno et al.

[11] Patent Number: 5,666,205
[45] Date of Patent: Sep. 9, 1997

[54] MEASURING METHOD AND EXPOSURE APPARATUS

[75] Inventors: Hiroki Tateno, Kawasaki; Koji Kaise, Kumagaya; Kyoichi Suwa, Yokohama; Yuji Imai, Tokyo, all of Japan

[73] Assignee: Nikon Corporation, Tokyo, Japan

[21] Appl. No.: 562,784

[22] Filed: Nov. 27, 1995

Related U.S. Application Data

[63] Continuation of Ser. No. 283,748, Aug. 1, 1994, abandoned, which is a continuation of Ser. No. 984,558, Dec. 2, 1992, abandoned, which is a continuation-in-part of Ser. No. 801,372, Dec. 2, 1991, abandoned.

[30] Foreign Application Priority Data

Dec. 3, 1990 [JP] Japan ............................ 2-400207
Dec. 6, 1991 [JP] Japan ............................ 3-349562

[51] Int. Cl.⁶ ............................................ G01B 11/00
[52] U.S. Cl. ............................................ 356/401
[58] Field of Search .......................... 356/399–401, 356/124; 355/53, 77

[56] References Cited

U.S. PATENT DOCUMENTS

| | | | |
|---|---|---|---|
| 4,579,453 | 4/1986 | Makita | 356/401 |
| 4,585,342 | 4/1986 | Lin et al. | 356/124 |
| 4,650,983 | 3/1987 | Suwa | 250/204 |
| 4,803,524 | 2/1989 | Ohno et al. | 355/53 |
| 4,871,237 | 10/1989 | Anzai et al. | 350/419 |
| 4,908,656 | 3/1990 | Suwa et al. | 355/53 |
| 5,117,225 | 5/1992 | Wang | 340/717 |

OTHER PUBLICATIONS

Webster's New World Dictionary; Third College Edition 1988, p. 707.

*Primary Examiner*—K. Hantis
*Attorney, Agent, or Firm*—Shapiro and Shapiro

[57] ABSTRACT

A measuring method comprises a first step to expose by the irradiation of a predetermined energy ray onto the resist layer of a photosensitive board a first mask pattern having at least two linear pattern portions arranged substantially in axial symmetry with respect to a straight line in a predetermined first direction and inclined at a predetermined angle to the straight line in the first direction, a second step to overlap with the first mask pattern image exposed on the resist layer a second mask pattern formed by the linear patterns which extend in a second direction substantially perpendicular to the first direction by relatively driving the second mask pattern in a predetermined amount in the first direction for exposure, and a third step to measure an interval in the second direction between at least two wedge-shaped resist images formed by the overlapped portions of the first mask pattern and the second mask pattern. The difference between the measured value and a predetermined standard value of the interval in the second direction may be obtained to determined a positional deviation.

15 Claims, 16 Drawing Sheets

MEASURING METHOD AND EXPOSURE APPARATUS

This is a continuation of application Ser. No. 08/283,748 filed Aug. 1, 1994, which is a continuation of application Ser. No. 07/984,558 filed Dec. 2, 1992, which is a continuation-in-part of application Ser. No. 07/801,372 filed Dec. 2, 1991, all now abandoned.

BACKGROUND OF THE INVENTION

1. Field of the Invention

The present invention relates to a measuring method and exposure apparatus. More particularly, the invention relates to exposure apparatuses (aligner, stepper, and others) required for the lithography process in fabricating semiconductor elements and the like, and to a method of checking the accuracy of the exposure apparatuses.

2. Related Background Art

In the lithography process in the fabrication of the semiconductor elements, circuit patterns and others formed on the original which is usually called photomask or reticle (hereinafter referred to as reticle collectively) are printed on the resist layer coated on a semiconductor wafer. Then, the required photoetching is performed with the resist pattern which is formed by the subsequent development process as its mask. In this process, particularly in using exposure apparatus therein, the reticle and wafer are set with a high-resolution projecting optical system therebetween, and subsequent to an accurate positioning of the reticle and wafer, the patterns on the reticle are exposed onto the wafer. In an exposure apparatus of this kind, there has been a trend that the integration of the circuit patterns to be printed on the wafer becomes increasingly higher and accompanying this tend, the width of the patterned lines has come into the region of sub-micron order.

Thus, in a stepper or other exposure apparatuses used for the lithography process which has become increasingly finer year after year, there has been provided an alignment system having a precision enabling an overall positioning on an order of several fractions to approximately 1/10 of the minimum line width in order to execute a highly precise positioning of the reticle and wafer. This alignment system comprises various alignment sensing systems for detecting the positioning (alignment) conditions between the reticle and wafer, a wafer staging system for stepping the wafer accurately, a reticle staging system for setting the reticle accurately, and others as its central components.

Also, there have been the methods given below for checking the accuracy of the exposure apparatus provided with the alignment sensing system, wafer staging system, and reticle staging system (such as the positioning accuracy of the wafer stage, the overlapping accuracy of the reticle and wafer, or the like).

(1) A test reticle provided with a special vernier pattern is prepared, and a double exposure is performed by displacing the wafer only by a predetermined amount so that the major scale and sub-scale of the vernier on the reticle are overlapped on the wafer. Then, the resist image of the vernier is observed by a microscope after its development.

(2) As disclosed in U.S. Pat. No. 4,803,524, two parallel linear patterns (diffraction grating type) are printed on the wafer at an interval, and subsequent to the development process, the interval between these two parallel linear patterns is self-measured by the alignment sensor in the exposure apparatus.

(3) As disclosed in U.S. Pat. No. 4,908,656, two sets of plural linear patterns set in parallel are doubly exposed so that these are overlapped at a predetermined angle to form a wedge-shaped overlapping portion. Then, the amount of the deviation is detected from the line width in such an overlapping portion.

In the conventional arts mentioned above, the following problems are encountered respectively.

(1) When the accuracy of the exposure apparatus is checked, the use of the vernier is employed for the method as if using slide calipers. As a result, the amount of the deviation and the measured value by the vernier become identical to each other 1:1, and depending on the observing method and others to examine the condition according to the state of the vernier pattern formation on the photosensitive board or optical microscope and other means, there is a possibly that a great measurement error is generated. Also, there are problems with the method of using the vernier patterns in that the calibrations should be read to check the misalignment in this method, thus making it difficult to automate the system. Not only is the processing speed slow, but the operator tends to get tired.

(2) In the method of measuring the interval between the two linear patterns, the measuring sensor should be provided with a high precision for detecting the resist images because the interval between the resist images of the linear patterns should be directly detected optically.

(3) In the method of measuring the line width of the wedge-shaped overlapping portion formed by the double exposure, the obtainable result is not accurate enough.

In the exposure apparatus of the kind, it is required to transfer a reticle pattern onto a wafer in a predetermined enlarged or reduced scale, and a mechanism for correcting imaging characteristics of a projection optical system, in particular, for correcting an error of a magnification or distortion is provided. In order to perform the correction, the error of the magnification amount or the distortion amount must be accurately measured first.

In a conventional exposure apparatus, in order to perform such a measurement, a specific pattern is formed on a reticle, and an optical member having a slit-like window is placed on an XYZ stage for three-dimensionally positioning the wafer. An image of the specific pattern on the reticle formed by the projection optical system and the slit-like window are converted into enlarged images having proper sizes, and the interval between the pattern image on the reticle and the slit-like window is measured based on the enlarged images. Then, the error of the magnification amount or the distortion amount of the projection optical system is obtained on the basis of a difference between the measured interval and a design value.

In the conventional measurement method, the XYZ stage and the measurement optical system are complicated. Since the interval between the image of the pattern on the reticle and the slit-like window on the XYZ stage is enlarged by the optical system, the measurement result often includes an error under the influence of aberrations of the optical system and a variation of characteristics of the optical system.

SUMMARY OF THE INVENTION

In consideration of the problems mentioned above, the present invention is designed with an objective to obtain a highly accurate method for measuring misalignment while permitting a high throughput.

In consideration of the above situation, the present invention has as another objective to provide an exposure apparatus, which can always stably measure an error of a magnification, a distortion amount, or an in-focus position of a projection optical system with a simple arrangement.

In order to achieve the above-mentioned objective, a method for measuring a misalignment may comprise, according to an embodiment of the present invention:

exposing a first mask pattern comprising at least two linear patterns arranged substantially in axial symmetry with respect to a predetermined first direction and with an inclination at a predetermined angle with respect to a straight line in the aforesaid first direction on the resist layer of a photosensitive substrate by the irradiation of a predetermined energy ray;

overlapping with the aforesaid first mask pattern exposed on the aforesaid resist layer a second mask pattern comprising a linear pattern extending in a second direction perpendicular to the aforesaid first direction by driving the second mask pattern by a predetermined amount in the first direction for exposure; and measuring the interval in the aforesaid second direction between the two wedge-shaped resist images formed by the overlapped exposure of the aforesaid first mask pattern and second mask pattern.

According to one preferred mode, the difference is obtained between a design value and the aforesaid measured value of the interval at the intersecting point of the aforesaid first mask pattern and second mask pattern to be overlapped by the driving as foreside, and an amount of the positional deviation when the first mask pattern in the first direction and the second mask pattern are overlapped is calculated on the basis of the aforesaid difference and the intersecting angle of the second mask pattern with the first mask pattern.

According to the present invention, at least two wedge-shaped patterns are formed by the double exposure of the first pattern and second pattern, and the interval between the two wedge-shaped patterns which varies in accordance with the misalignment of the two wedge-shaped patterns is obtained, and the amount of the positional deviation is obtained based on this interval and the intersecting angle of the two patterns. Consequently, the method is hardly affected by the various processes in forming patterns, so that the misalignment can be measured highly accurately. Also, the pattern interval is obtained by an automatic measurement to make it possible to perform the measurement with a high throughput. Hence, a highly accurate inspection of the precision of an exposure apparatus can be performed with a high throughput. Moreover, the detection of the positional deviation can be made highly accurate with ease because the detection sensitivity can be modified (measurement error can be minimized) depending on the intersecting angle of the two patterns.

As shown in, e.g., FIG. 13, an exposure apparatus according to the present invention for transferring a pattern on a reticle R on a first surface on to a substrate W on a second surface via a projection optical system PL, may comprise a plurality of specific pattern portions pre-formed on the reticle R on the first surface, a light-receiving means, having a light-receiving surface arranged on the second surface at substantially the same level as that of the substrate W, for detecting an interval between images of the plurality of specific pattern portions formed by the projection optical system PL, and an arithmetic means for calculating a magnification or a distortion of the projection optical system PL in a predetermined measuring direction on the basis of the detected interval.

DESCRIPTION OF THE PREFERRED EMBODIMENTS

Figure 2:
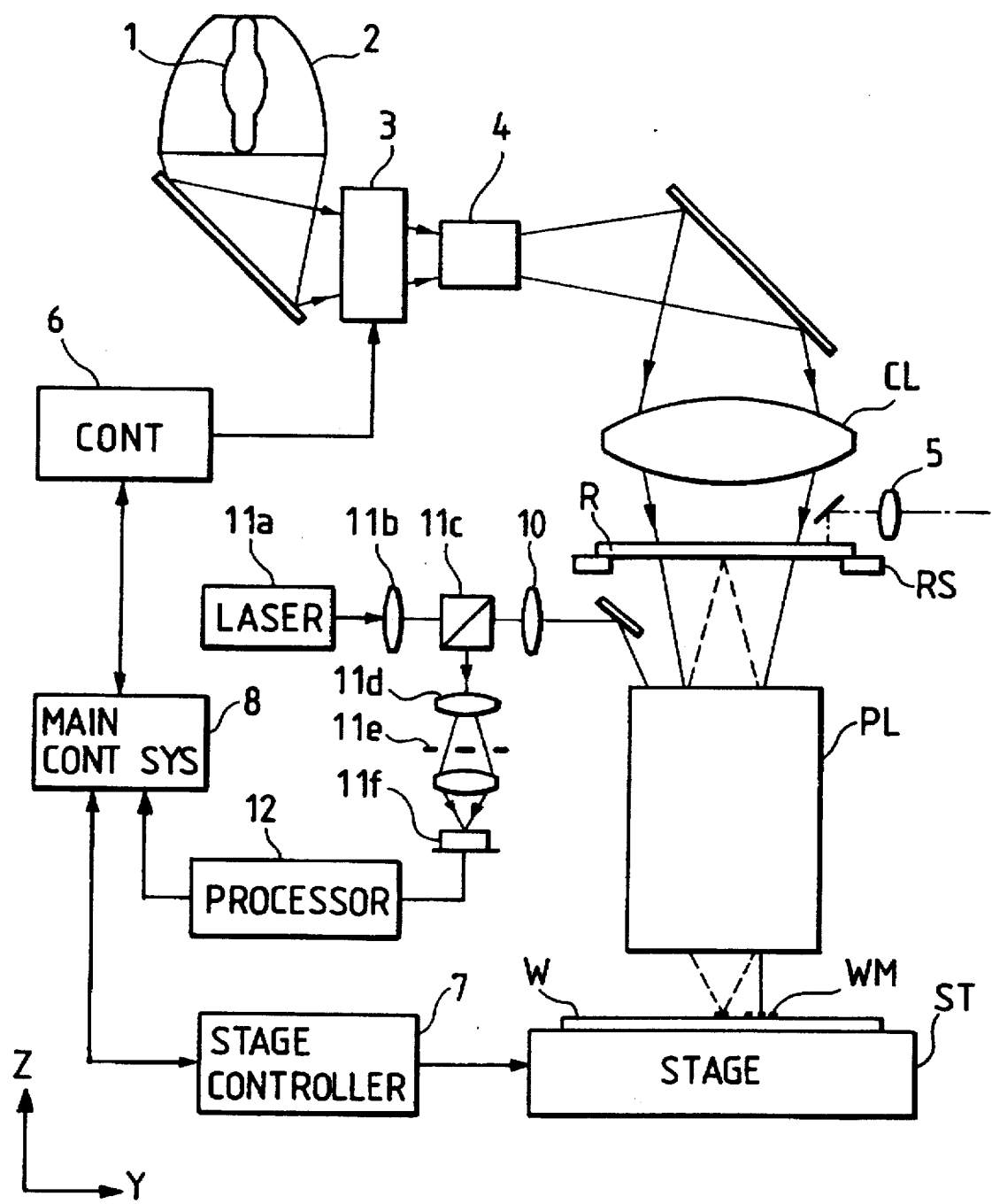
FIG. 2 is a plan view schematically showing an apparatus suitably adaptable to implementing the first embodiment according to the present invention.

With reference to FIG. 2, a description will be briefly made of the structure of a stepper suitably adaptable to a first embodiment according to the present invention. In FIG. 2, the exposure rays of light (g line and i line) from a mercury lamp 1 are converged by an oval mirror 2 to illuminate a reticle R through a shutter 3 which controls exposure, optical integrator 4 which equalizes the illuminating light, and main condenser lens CL. The reticle R is supported on a reticle stage RS which is finely movable in the x, y, and θ (rotation) directions, and is positioned by a reticle alignment system 5 with respect to the apparatus. The patterns on the reticle R are projected onto a wafer W for the image formation by a projection lens PL which is telecentric either on one side or on both sides. The wafer W is mounted on a wafer stage ST including an x-y stage which travels horizontally within the x-y coordinate system, z stage which travels vertically along the optical axis of the projection lens PL, θ stage which rotates finely in a horizontal plane. The stage is operated to cause the wafer to step by the step and repeat method of exposure in response to the instruction from a stage controller 7. Also, there is provided in this stepper, a wafer alignment system 11 of TTL (through the lens) type whereby alignment marks WM (diffraction grating type) on the wafer are photoelectrically detected through the projection lens PL. In the wafer alignment system 11, there are provided a laser light source 11a having He—Ne, He—Cd, Ar ion, and the like as its light source, lens system 11b including cylindrical lens and others, beam splitter 11c, object lens 10, pupil relay lens system 11d, spatial filter 11e, and light receiving element 11f, and the photoelectric signals from the light receiving element 11f are output to a signal processing system 12. Here, the beam from the laser light source 11a is converted by the function of the lens system 11b into a beam having a slit cross-section extending one way, which enters a location off the axis of the projection lens PL through the beam splitter 11c and object lens 10 and is converged on the wafer W by the projection lens PL as a spot ray of light SPx having its longitudinal direction in the y direction.

When the alignment marks WM on the wafer W and the spot ray of light SPx are overlapped, scattered light and diffracted light are generated from the marks. The scattered and diffracted lights are returned to the object lens 10 again through the projection lens PL and reflected by the beam splitter 11c to reach the spatial filter 11e through the pupil relay system 11d. The pupil relay system 11d serves to allow the pupil of the projection lens PL and the spatial filter 11e to be conjugated, and the spatial filter 11e has an aperture which allows only the diffracted light and scattered light to pass therethrough while shielding the positive reflection light from the wafer surface. The scattered and diffracted lights having passed through the spatial filter 11e are converged by the lens system to reach the light receiving element 11f.

Although not shown in FIG. 2, there is provided in the stage controller 7, a laser interferometer system for measuring the position of the wafer stage ST with respect to the x two direction, and the signal processing system 12 performs the digital sampling of the waveforms of the photoelectric signals from the light receiving element 11f in response to the measuring pulse (up-down pulse) output from this laser interferometer system for each of the unit (0.02 μm, for example) driving of the stage ST. When the position of the slit type spot ray of light SPx and the alignment marks are matched, the signal processing system 12 obtains the position thereof in the x direction on the basis of the sampled signal waveform with the aid of a high-speed arithmetic processor, and outputs the position to the main controlling system 8. In the above-mentioned mark detecting method, it is necessary for the extraction of the signal waveform to drive the wafer W in the x direction with respect to the slit type spot ray of light SPx which is at rest within the field of the projection lens PL. In this respect, the main controlling system 8 controls the overall alignment sequence as well as controls the open and close timing and the opening time of the shutter 3 in exposure through the shutter controller 6. Further, although not shown in FIG. 2, another alignment systems is provided for measuring the position in y direction to make an image formation of the slit type spot ray of light SPy on the wafer W, thus enabling the mark detection in the y direction as well as in the x direction.

In the stepper shown in FIG. 2, the wafer alignment system 11 of the TTL type is provided for detecting the alignment marks on the wafer W. In an embodiment set forth below, the system is shared to be used for measuring the interval between the resist measurement patterns formed on the wafer W.

Figure 3:
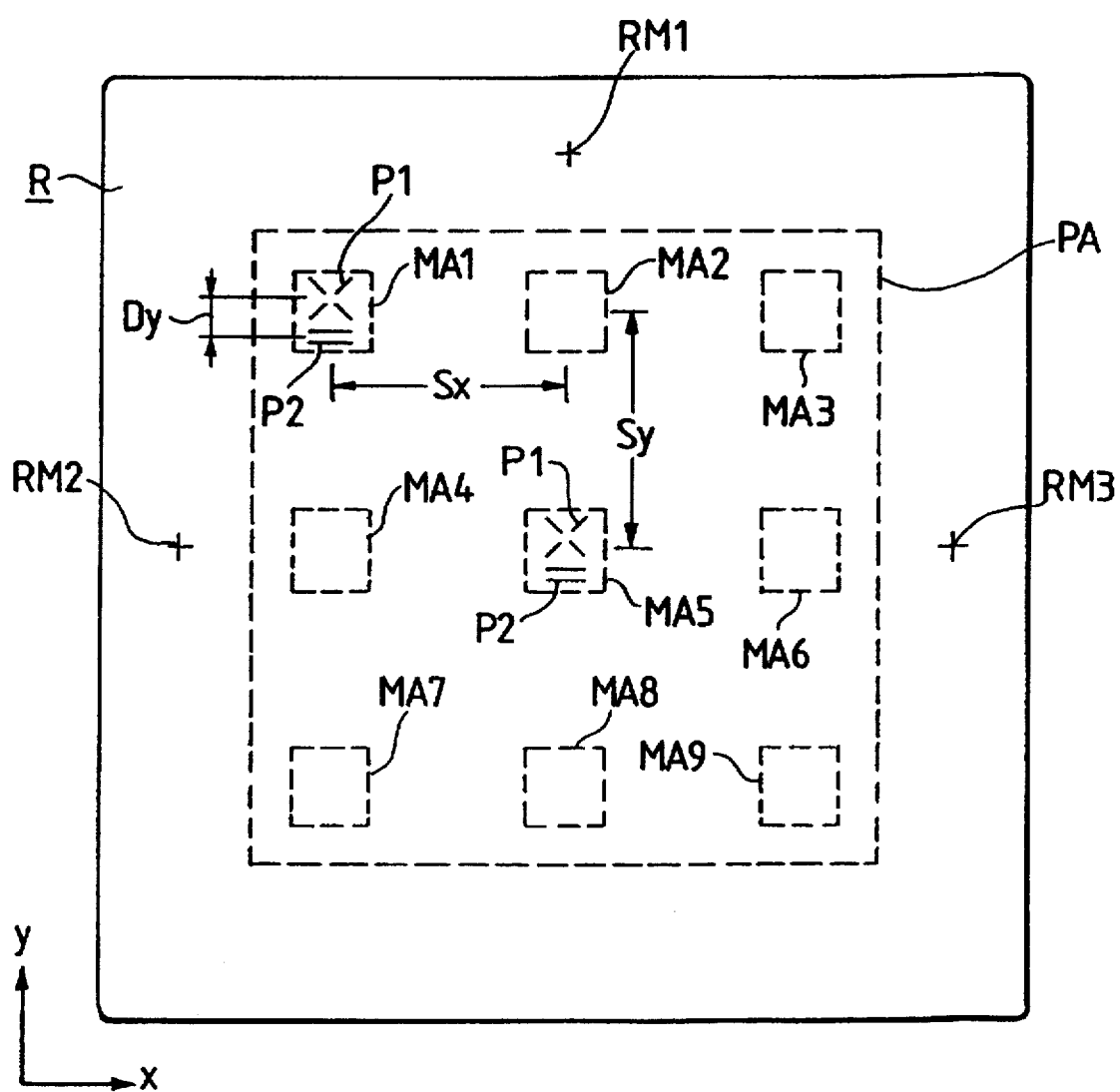
FIG. 3 is a plan view showing the arrangement of the misalignment measuring patterns on a reticle R according to the first embodiment of the present invention.

FIG. 3 is a plan view illustrating the pattern arrangement on a test reticle R prepared for the implementation of the first embodiment described herein.

At three sides of the test reticle R, the reticle alignment marks $RM_1$, $RM_2$, and $RM_3$, which are detected by the reticle alignment system 5 shown in FIG. 2, are formed. With these marks $RM_1$, $RM_2$, and $RM_3$ at three locations as references, a pattern area PA is formed in the center of the reticle R. In the present embodiment, mark areas $MA_1$ through $MA_9$ are formed in nine locations, center, four corners, and four sides, of the pattern area PA. The mark areas are arranged with the mark area $MA_5$ in the center of the pattern area PA, with the remaining mask areas disposed about the area $MA_5$ at a pitch Sx in the x direction and a pitch Sy in the y direction. In the central mark area $MA_5$, a pair of the pattern P1 (the first mask pattern of the present invention) which is inclined at a predetermined angle to the x axis and the pattern P2 (the second mask pattern of the present invention) which is extended in the x direction are formed. Then, in each of the other mark areas $MA_1$ to $MA_9$, the same patterns as P1 and P2 in the mark area $MA_5$ are formed. In FIG. 3, the patterns P1 and P2 are represented only in the mark areas $MA_1$ and $Ma_5$. Here, the interval between the patterns P1 and P2 is represented as Dy, and is stored in the memory in the main controlling system 8 as a design value in advance. In this respect, however, the arrangement of the patterns P1 and P2 is not limited thereto and the interval between the pattern P1 and P2 is not limited to a particular value of Dy, either. Also, the mark area MA are not limited to the $MA_1$ through $MA_9$. These area can be arrange in any way for the purpose of detecting the amount of the positional deviation.

Figure 4A:
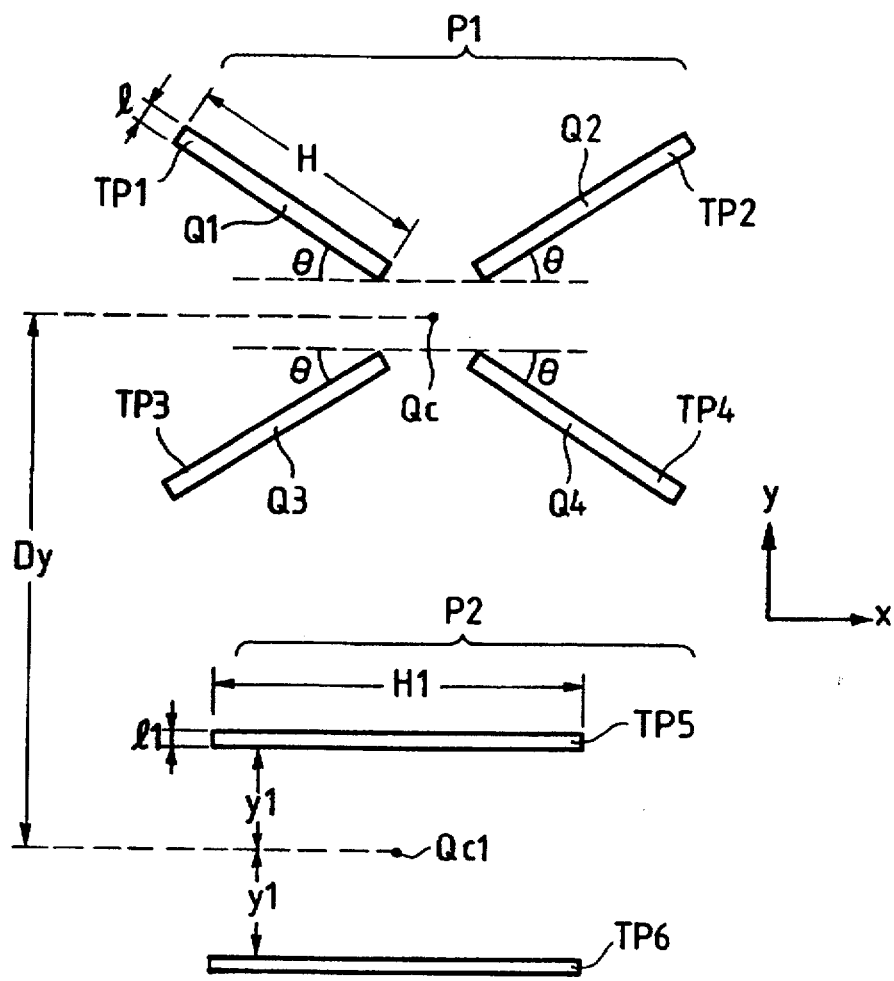
FIG. 4A is a plan view illustrating the misalignment measuring patterns P1 and P2 in the first embodiment according to the present invention.

FIG. 4A illustrates the shapes of the patterns P1 and P2 on the aforesaid reticle R in detail.

The pattern P1 is formed with four patterns TP1 through TP4.

The pattern TP1 and pattern TP4 are both of a linear light shading pattern slanting down towards the right side (slanting up towards the left side) at an angle θ to the x axis, and for both the width is l while the length is H. The patterns TP2 and TP2 and are both of a linear shading pattern slanting up towards the right side (slanting down towards the left side) at an angle θ to the x axis, and for both the width is l while the length is H. The adjacent two patterns should be slanted so as to maintain an axial symmetry between them (for example, the pattern TP1 and pattern TP2 are axially symmetrical in the y direction while the pattern TP1 and pattern TP3 are axially symmetrical in the x direction). In other words, to an ideal center point Qc, the patterns TP1 and TP4 and the patterns TP2 and TP3 are in the relationship of point symmetries. Also, each of the patterns TP1 through TP4 has the two linear edges extending in its slanting direction. Here, assuming that the respective central positions of the patterns TP1 through TP4 are Q1 through Q4, the y coordinate values of the central points Q1 and Q2 on the test reticle R are equal in one mark area and the y coordinate values of the central points Q3 and Q4 on the test reticle R are also equal in one mark area. Also, the x coordinate values of the central points Q1 and Q3 on the test reticle R are equal and the x coordinate values of the central points Q2 and Q4 on the test reticle R are equal.

The pattern P2 is formed with two patterns TP5 and TP8. Each of the patterns is of a linear shading pattern extending in the x axial direction with the width l1 and length H1. The interval between the patterns TP5 and TP6 is 2 y 1, and the center point of the patterns TP5 and TP6 with respect to the y direction is $Qc_1$. Here, each of the patterns has two linear edges extending in the x axial direction. As described earlier, the internal between the patterns P1 and P2 (interval between the points Qc and $Qc_1$) is Dy.

Next, the description will be made of the misalignment measuring method according to the first embodiment of the present invention.

Figure 4B:
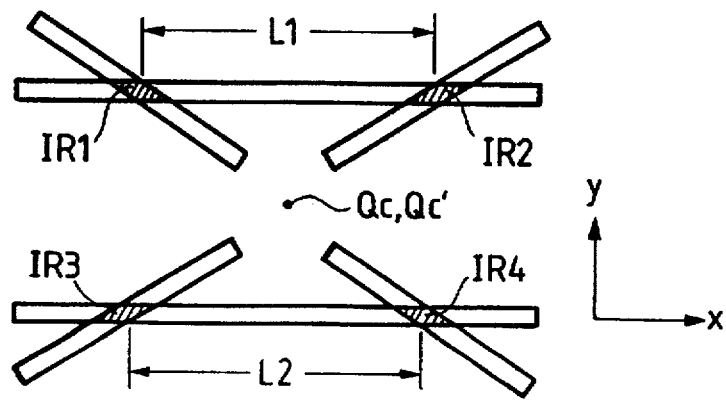
FIG. 4B is a plan view illustrating the overlapping state of the patterns P1 and P2 in the first embodiment according to the present invention.

The test reticle R shown in FIG. 3 is set on the reticle stage RS of the stepper main body shown in FIG. 2, and by the reticle alignment system 5, the test reticle R is aligned at a predetermined position. The stepper prints sequentially the projected images of the pattern area PA on the test reticle R on the photosensitive emulsion layer (resist layer) on the wafer W by the step and repeat method in accordance with a predetermined exposure sequence (first print). At this juncture, in one shot area on the wafer W, the mark areas $MA_1$ through $MA_9$ in the nine locations as shown in FIG. 3 are transferred to the resist layer as latent images. Then, an overlapping printing (second print) is performed using the same test reticle R for each of the shot areas where the exposure has just been executed. Now, the images on the pattern area PA to be projected are overlapped with the shot area exposed for the first time by stepping the stage ST in the y direction accurately by the amount m·Dy (where m is a reduction ratio of the projection lens PL, a 1/5, 1/10, or the like). By this operation, on the resist layer in one shot area on the wafer, the double exposed latent images of the pattern P1 and pattern P2 are formed as represented by the hatched portions in FIG. 4B in each of the eight mark areas $MA_1$-$MA_4$, $MA_6$-$MA_9$. FIG. 4B represents the overlapping state of the patterns P1 and P2. Subsequently, this wafer W is transferred to a coater/developer (an apparatus having a resist coating section and development section integrally) and is again mounted on the wafer stage ST after a predetermined development process is completed.

Consequently, on the wafer W, only the wedge-shaped resist patterns IR1 through IR4 are formed as represented by the hatched portions in FIG. 4B. In this case, the kind of resist can be of positive resist or negative resist. Here, since the patterns P1 and P2 are light shading patterns, the wedge-shaped patterns are those portions which have not been exposed by the double exposure, and if the resist layer is of the positive resist, those portions become convex due to the remaining resist layer. If the resist layer is of the negative resist, those portions become concave because the resist layer has been removed. In the present embodiment, using positive resist, the convex resist patterns are formed. Also, the patterns P1 and P2 can be transmittable patterns. For example, using negative resist, the wedge-shaped convex patterns can be formed if the exposure time is set so that only the resist layer of the portions which have been doubly exposed may remain.

Next, by the aforesaid wafer alignment system 11, the interval between the wedge-shaped patterns IR1 and IR2 and the interval between the wedge-shaped patterns IR3 and IR4 are measured. Here, the interval between the center of the wedge-shaped pattern IR1 in the x direction and that of the wedge-shaped pattern IR2 in the x direction is given as L1 while the interval between the center of the wedge-shaped pattern IR3 in the x direction and that of the wedge-shaped pattern IR4 in the x direction is given as L2. As described earlier, the overlapping operation is performed so that the center point Qc of the pattern P1 and the center $Qc_1$ of the pattern P2 can be matched. Accordingly, the intervals L1 and L2 are equal unless there is any step error. However, the intervals L1 and L2 can be varied in response to each amount of the positional deviation if a misalignment has been generated in overlapping.

Also, the amount of the positional deviation in the y direction (the direction perpendicular to the measuring direction) is calculated on the basis of the intervals between the actually exposed wedge-shaped patterns and the intersecting angle θ (design angle) of the pattern P1 and pattern P2.

Figure 1A:
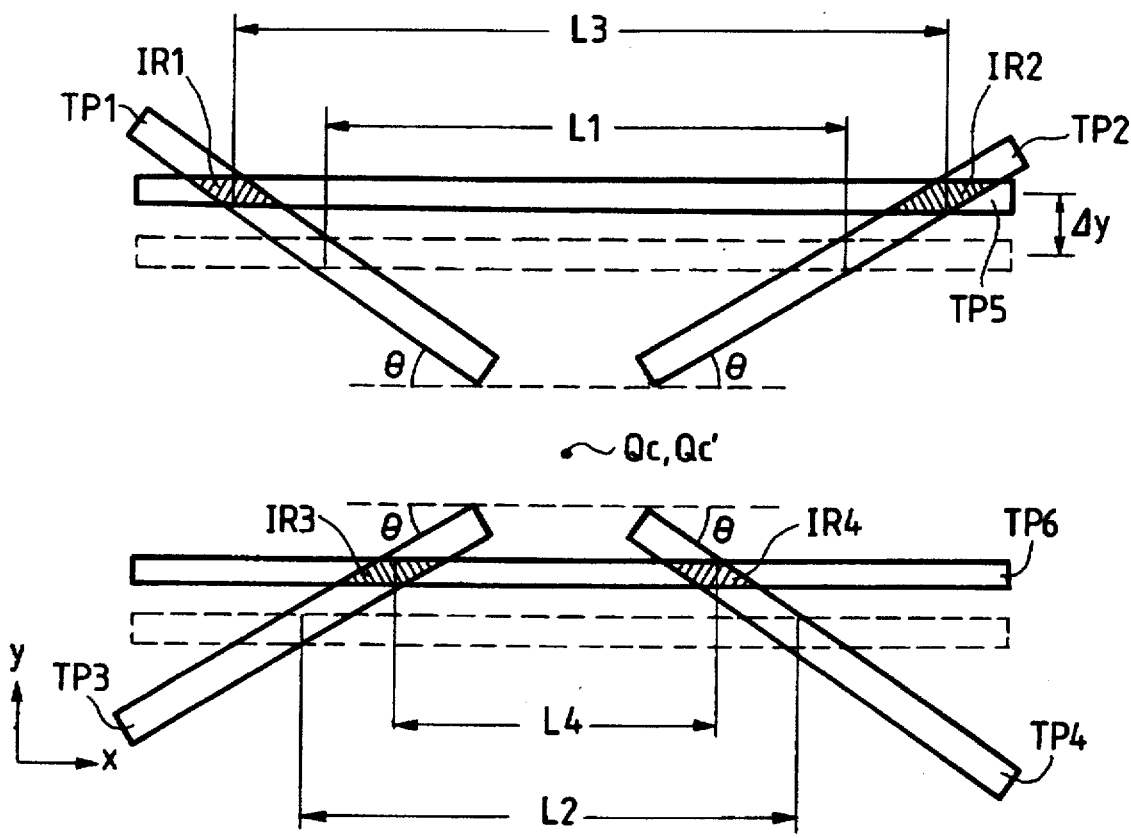
FIG. 1A is a plan view illustrating a state where the misalignment measuring patterns according to a first embodiment of the present invention are misaligned.
Figure 1B:
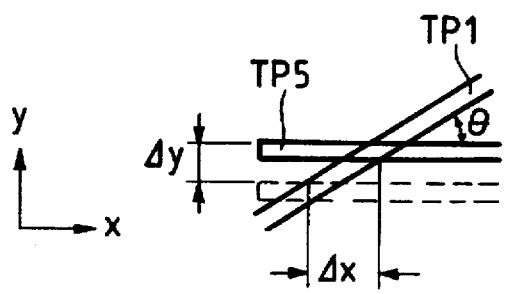
FIG. 1B is a plan view illustrating the relationship between the measuring direction and the misalignment direction in the first embodiment according to the present invention.

Here, in reference to FIG. 1, the description will be made of the principle for obtaining the amount of the positional deviation. FIG. 1A illustrates a stage where the pattern P1 and pattern P2 (patterns TP5 and TP6) are overlapped with a relative deviation of Δy in the y direction while FIG. 1B illustrates a deviational relationship in the x direction and y direction when there is a misalignment between the pattern P1 and pattern P2. In this respect, the dotted lines indicate the location of the pattern P2 when there is no misalignment. Now, as shown in FIG. 1A, if the two patterns are overlapped with the positional deviation Δy in the y direction, the interval L1 between the wedge-shaped patterns becomes L3 while the interval L2 becomes L4. Here, it is assumed that the misalignment is generated in a direction such that the positional deviation shows a relationship of L1<L3, L2>L4. This is defined as + (plus) direction. In this case, the deviation amount in the x direction Δx is expressed by an equation (1) when the two patterns, pattern P1 and pattern P2, are inclined at θ as shown in FIG. 1B.

$$\Delta x = \Delta y / \tan \theta \quad (1)$$

Therefore, the intervals L3 and L4 in this case are expressed by equations (2) and (3) respectively.

$$L3 = L1 + 2\Delta y / \tan \theta \quad (2)$$

$$L4 = L2 - 2\Delta y / \tan \theta \quad (3)$$

Here, since L1=L2, L3–L4 is expressed by an equation (4).

$$L3 - L4 = 4\Delta y / \tan \theta \quad (4)$$

As a result, the amount of the positional deviation Δy is expressed by an equation (5).

$$\Delta y = (L3 - L4) \tan \theta / 4 \quad (5)$$

When that the wedge-shaped patterns having their longitudinal direction in the x direction are used as set forth above, the detected amount Δx (Δx=Δy/tanθ) has a sensitivity of 1/tanθ where the amount of the positional deviation is Δy. Then, the misalignment in the y direction is obtained by the measurement in the x direction. Consequently, it is possible to measure the misalignment with an extremely high precision depending on a setting value of θ. Also, by changing the setting values of θ, it is possible to determine the required measurement sensitivity freely. Moreover, in the present embodiment, the amount of the positional deviation is obtained by the difference between L3 and L4 (by difference calculation) using the four wedge-shaped patterns. Therefore, if the intersecting angles are provided in a same condition, the obtainable sensitivity becomes four times as much as the conventional art where the measurement has been performed with only one pattern. There is also a lesser influence by the deformation of the patterns occurring in the process of the pattern formation, hence making it possible to implement a highly accurate measurement of the amount of the positional deviation.

Also, it is possible to obtain the same sensitivity as has been obtained in the conventional art using only one pattern by the intersecting angle of as much as four times. From this point of view, the influence by the process in the pattern formation can be reduced.

Here, if the intersecting angle θ is below 45° and the smaller it is, the longer becomes the longitudinal direction (x direction) of the wedge-shaped pattern, and the higher becomes the detecting accuracy. However, if the angle is too small, the acute angle portions of the wedge-shaped pattern become deformed. Then, an accurate measurement of the pattern position becomes impossible. It is therefore desirable to make the intersecting angle θ smaller but not to the extent that the shape of the wedge-shaped pattern is deformed.

A misalignment measuring method using an overlapping exposure such as this is extremely efficient in examining the various accuracies of the stepper, i.e., the stepping precision of the wafer stage ST, the overlapping accuracy when a positioning is performed by the alignment system for the pattern P1 and pattern P2 which have been formed on the different reticles R, the distortion (including magnification errors) of the projection lens, shot rotation, yawing, and the like.

Next, the description will be made of an example of the method for automatically measuring the amount of the positional deviation on the basis of the intervals between the aforesaid wedge-shaped patterns IR1 through IR4.

Figure 5A:
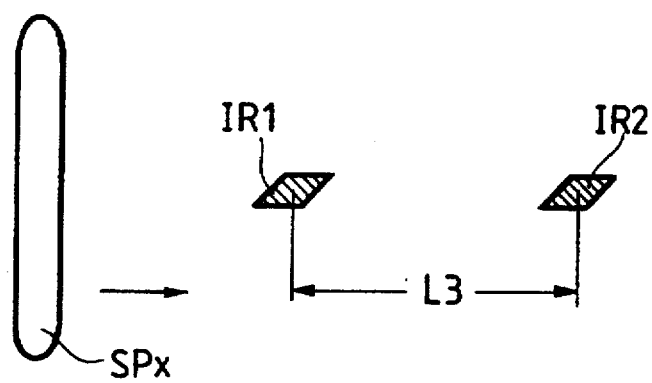
FIG. 5A is a plan view illustrating the relative scanning of a spot light and wedge-shaped patterns.
Figure 5A:
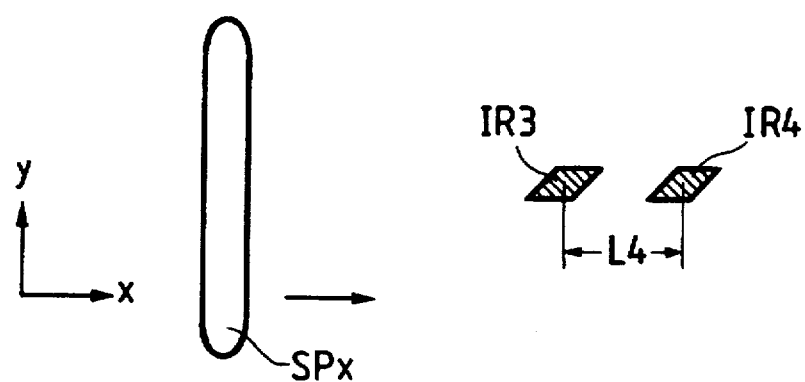

It is assumed that this automatic measurement is performed by sharing the TTL type alignment system 11 provided in the main body of the stepper shown in FIG. 2, and that the intersecting angle θ of the patterns P1 and P2 is stored in the memory in the main controlling system 8 in advance. FIG. 5A illustrates a state where the wedge-shaped patterns are being measured by the TTL type alignment system 11.

Figure 5B:
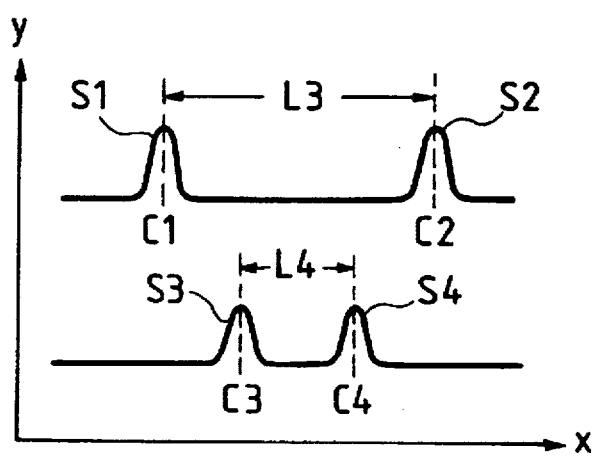
FIG. 5B is a plan view illustrating the signal waveforms obtained by the relative scanning shown in FIG. 5A.

The alignment system 11 projects a slit type spot ray of light SP onto the wafer W through the projection lens PL as described earlier, and photodetects the edge scattering rays of light from the wedge-shaped resist patterns IR1 and IR2 to store the photoelectric signals in synchronism with pulses of the interferometer in the stage controller 7. Then, by analyzing the stored signal waveforms in the main controlling system 8, the positions of the patterns IR1 and IR2 are obtained in the wafer coordinate system. FIG. 5B represents the photoelectric waveforms from the photoelectric element which receives the edge scattering rays of light, and the center positions C1 and C2 of the signal waveforms S1 and S2 gained from the resist patterns IR1, and IR2 are obtained by the signal processing circuit 12, hence obtaining the interval L3 between the patterns IR1 and IR2 by taking the absolute value of the difference between the C1 and C2. Likewise, by obtaining the center positions C3 and C4 of the signal waveforms S3 and S4 gained from the patterns IR3 and IR4, the interval L4 between the patterns IR3 and IR4 is obtained.

Thus, it is possible to obtain the amount of the positional deviation Δy between the patterns P1 and P2 by executing the calculation by the aforesaid equation (5). Here, this calculation is assumed to be performed by the main controlling system 8.

Also, it is conceivable that by using the short-length direction of the wedge-shaped patterns, a method can be established to obtain a yawing amount.

Now, the operation of the present embodiment will be described in reference to FIG. 6.

Figure 6:
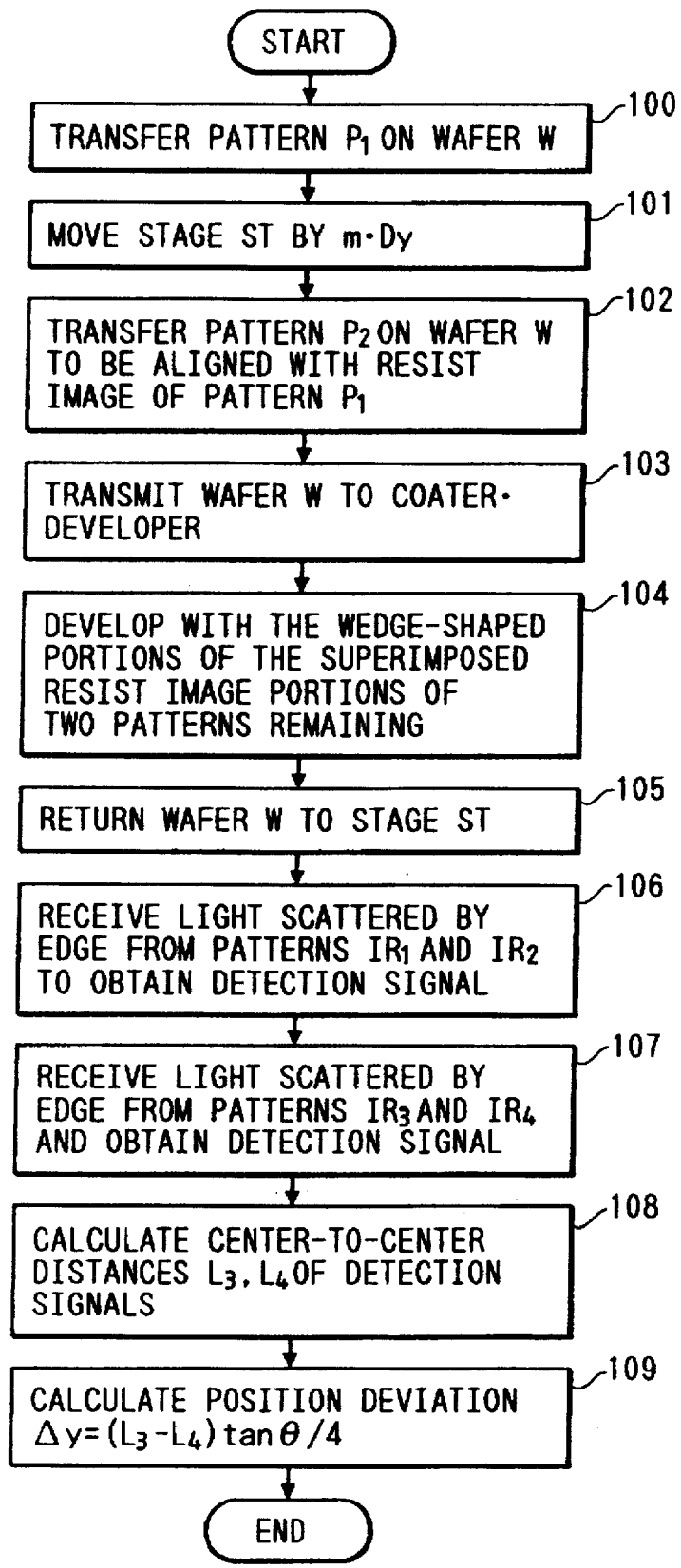
FIG. 6 is a flowchart illustrating the operation of the first embodiment according to the present invention.

FIG. 6 is a flowchart illustrating briefly the operation of the present embodiment.

[Step 100]

The pattern P1 on the reticle R is transferred onto the wafer W to form the resist image (latent image) of the pattern P1 on the wafer W (first print).

[Step 101]

The stage ST is driven in the y direction by an amount m·Dy.

[Step 102]

The pattern P2 on the reticle R is transferred onto the wafer W so as to overlap this pattern with the resist image (latent image) of the pattern P1.

[Step 103]

The wafer W is transferred to the coater/developer.

[Step 104]

By the development process, there remain the resists of the overlapping portions (wedge-shaped portions) IR1 through IR4 of the resist images of the two patterns, pattern P1 and pattern P2.

[Step 105]

The wafer W is returned onto the stage ST.

[Step 106]

The stage ST is driven in the x direction to scan the wedge-shaped patterns IR1 and IR2 and the spot ray of light SPx for alignment relatively, so that the edge scattering rays of light are received to obtain the detection signals.

[Step 107]

As in the step 106, the detected signals from the wedge-shaped patterns IR3 and IR4 are obtained.

[Step 108]

The distances L8 and L4 between the centers of the detected signals are calculated.

[Step 109]

The amount of the positional deviation Δy is calculated in accordance with the equation (5).

From the above-mentioned steps, the amount of the positional deviation in the y direction can be obtained.

Here, the misalignment in the x direction can also be detected by the same method for obtaining the pattern intervals in the y direction with patterns which are gained by rotating 90° the patterns in the mark areas $MA_1$ through $MA_9$. Also, it may be possible to do likewise by forming y direction measurement patterns in appropriate four areas in the mark areas $MA_1$ through $MA_9$ while forming x direction measurement patterns in the remaining five areas.

Figure 7:
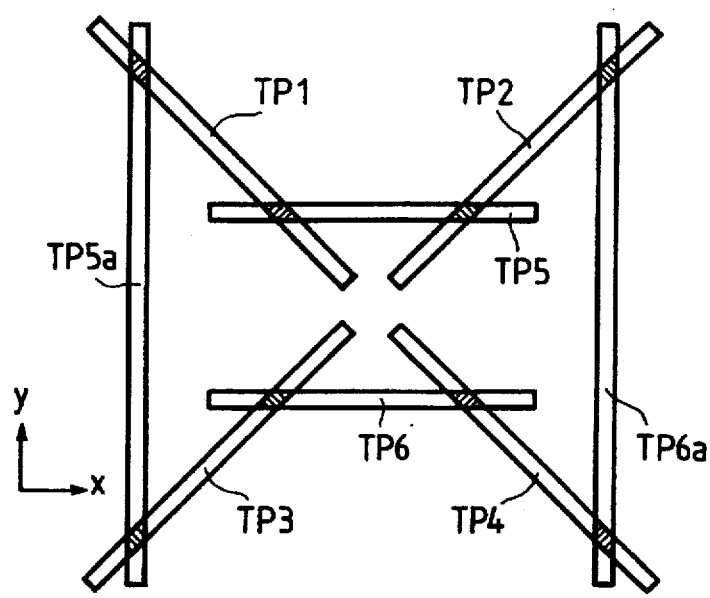
FIG. 7 is a plan view showing an example of a variation of the misalignment measuring patterns according to the first embodiment of the present invention.

Further, in the above-mentioned method, the pattern formed in one mark area is a pattern for performing the measurement either in the x or y direction only. However, as shown in FIG. 7, it is possible to form the patterns TP5a and TP6a having the measurement directions both in the x and y directions in one mark area. Thus, the space occupied by the patterns P1 and P2 on the reticle R is reduced so that the measuring points can be increased.

Figure 8:
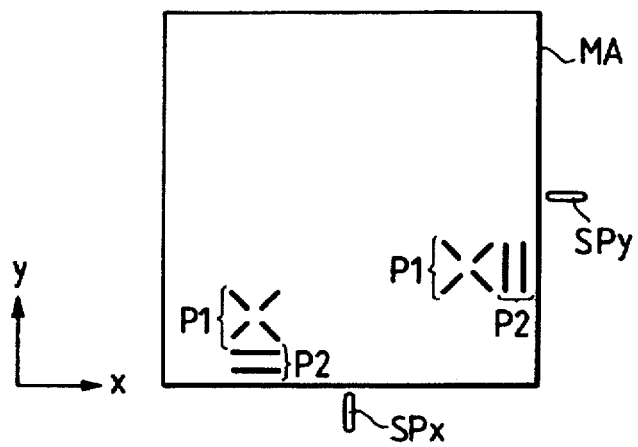
FIG. 8 is a plan view showing an example of a variation of the arrangement of the misalignment measuring patterns according to the first embodiment of the present invention.

Also, it is possible to form two sets of patterns P1 and P2 having the measurement directions in the x and y directions, respectively, as shown in FIG. 8. Hence, the driving distances of the stage ST can be shortened when the measurements are performed in the two directions.

Here, in the present embodiment, while the amounts of the positional deviations are gained from the respective intervals L3 and L4 in the upper section (patterns TP1, TP2, and TP5) and the lower section (patterns TP3, TP4, and TP6) in FIG. 1A, such an amount can be obtained either from the upper section or lower section. If, for example, only the upper section is used, the amount of the positional deviation Δy can be obtained in an equation given below.

$$\Delta y = (L3-L1) \tan \theta/2 + tm \quad (6)$$

Here, the sensitivity in this case becomes a half of that obtainable using all the patterns TP1 through TP6.

Figure 9:
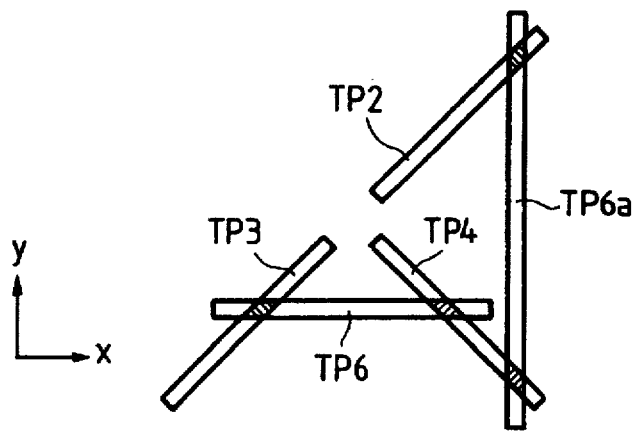
FIG. 9 is a plan view showing an example of a variation of the misalignment measuring patterns according to the first embodiment of the present invention.

Further, it is possible to perform the measurements both in the x and y directions using the two wedge-shaped patterns shown in the hatched portions in each of the x and y directions of the patterns illustrated in FIG. 9.

The above descriptions have been made of the operation in a case where the stepping accuracy is measured for the stage ST. However, when the alignment accuracy should be measured, the steps 100 through 102 are replaced with the steps 10 through 40 which are given below using the reticle R1 on which the alignment marks and pattern P1 are formed and the reticle R2 on which the pattern P2 is formed to be overlapped with the pattern P1 at a predetermined position.

[Step 10]

The pattern P1 and the alignment marks on the reticle R1 are transferred onto the wafer W (first print).

[Step 20]

The wafer W is transferred to the coater/developer.

[Step 30]

The resist images of the patterns P1 and alignment marks are formed by development process.

[Step 40]

The wafer W and reticle R2 are aligned to overlap the pattern P1 with the pattern P2. Then, the pattern P2 is transferred onto the wafer W.

Thereafter, in the aforesaid step 103 and on, the operation is executed to obtain the alignment errors as in the case of obtaining the stepping errors.

Here, at this juncture, it is assumed that there is used the resist in which the portions irradiated by light can be removed even after the development process.

Now, in reference to FIG. 10, a second embodiment according to the present invention will be described.

Figure 10:
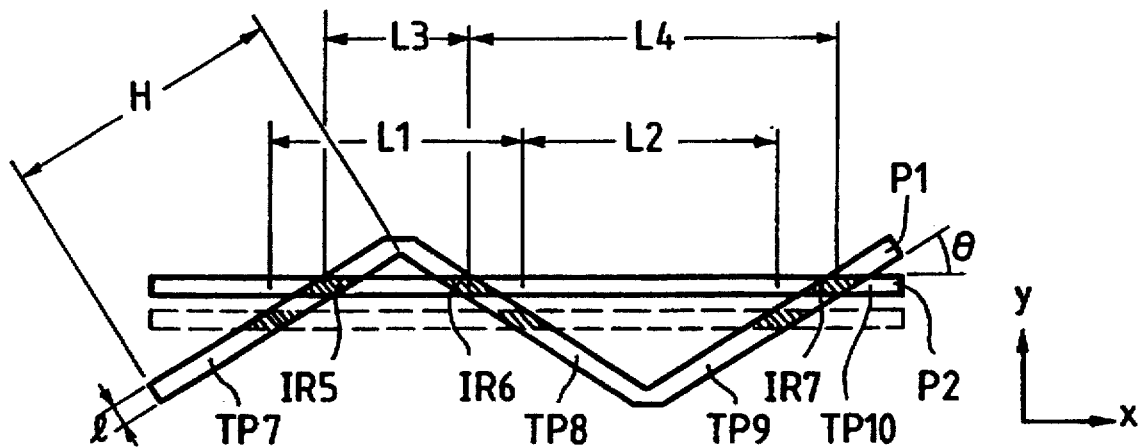
FIG. 10 is a plan view illustrating the misalignment measuring patterns according to a second embodiment of the present invention.

FIG. 10 is a plan view illustrating a pattern suitably adaptable to the second embodiment.

Patterns TP7, TP8, and TP9 constitute a pattern P1 while a pattern TP10 constitutes a pattern P2.

In the present embodiment, the wedge-shaped patterns IR2 and IR3 in the first embodiment are commonly used so that a pattern having three measurement points is structured while maintaining the same sensitivity as in the first embodiment.

The patterns TP2 and TP3 in the first embodiment correspond to the patterns TP9 and TP7, respectively. Also, the patterns TP1 and TP4 in the first embodiment correspond to the pattern TP8 in the present embodiment, and the patterns TP1 and TP4 are replaced with the pattern TP8. Further, the patterns TP5 and TP6 are replaced with the pattern TP10.

Consequently, in the same manner as in the first embodiment, the double exposure is performed to obtain the difference between the interval L3 of the wedge-shaped patterns IR5 and IR6 and the interval L4 of the patterns IR6 and IR7, on the basis of which the amount of the positional deviation is obtained by the equation (5). Here, if there is no misalignment, the interval between the patterns IR5 and IR6 is given as L1 and the interval between the patterns IR6 and IR7 is given as L2. Then, L1 and L2 are assumed to be the same. The dotted lines indicate the case where no misalignment occurs.

Now, in reference to FIG. 11, a third embodiment according to the present invention will be described.

Figure 11:
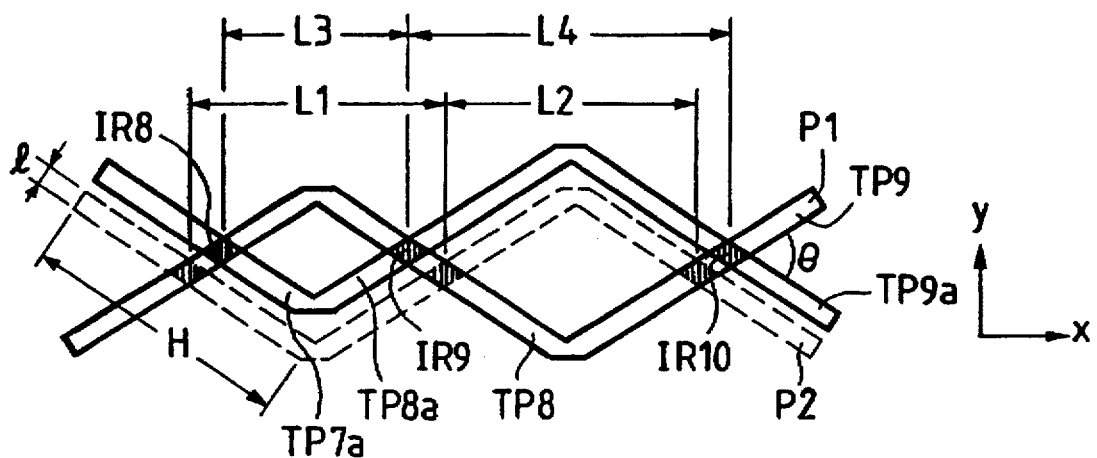
FIG. 11 is a plan view illustrating the misalignment measuring patterns according to a third embodiment of the present invention.

FIG. 11 is a plan view illustrating a pattern suitably adaptable to the third embodiment.

Patterns in the present embodiment (FIG. 11) are formed in such a manner that in the patterns in the second embodiment, the pattern P2 (in FIG. 10) according to the second embodiment is replaced with a pattern P2 (in FIG. 11) which is a pattern formed to be axially symmetrical with respect to the x axis, and that the pattern P2 thus formed is combined with the pattern P1 of the second embodiment. As shown in FIG. 11, the patterns TP7, TP8, and TP9 of pattern P1 and patterns TP7a, TP8a, and TP9a of pattern P2 are respectively in axially symmetrical relation to each other with respect to the x axis.

Then, the double exposure is performed as in the first embodiment to obtain the difference between the interval L3 of the wedge-shaped patterns IR8 and IR9 and the interval L4 of the patterns IR9 and IR10. In forming the patterns in such a way as this, the wedge-shaped patterns IR8, IR9, and IR10 formed by the double exposure are substantially the same in the shapes thereof, and the effects produced on them by the development process and the like are given with a similar tendency, thus making it possible to implement a more accurate misalignment measurement. In this case, the amount of the positional deviation in the y direction Δy can be obtained by the equation given below.

$$\Delta y = (L3-L4) \tan \theta/2)/2 \quad (7)$$

Here, if there is no misalignment, the interval between the patterns IR8 and IR9 is given as L1 and the interval between the patterns IR9 and IR10 is given as L2. Then, L1 and L2 are assumed to be the same. The dotted lines indicate the case where no misalignment occurs.

In this respect, the sensitivity in this case becomes a half of that obtainable by using the patterns as shown in FIG. 1A.

Also, the above-mentioned embodiment shows an example of the present invention, and as far as the interval measurement is performed in the conditions set forth above, the shape of the pattern can be either of the continuous type as shown in the embodiment or of the mark type as in the first embodiment.

Figure 12A:
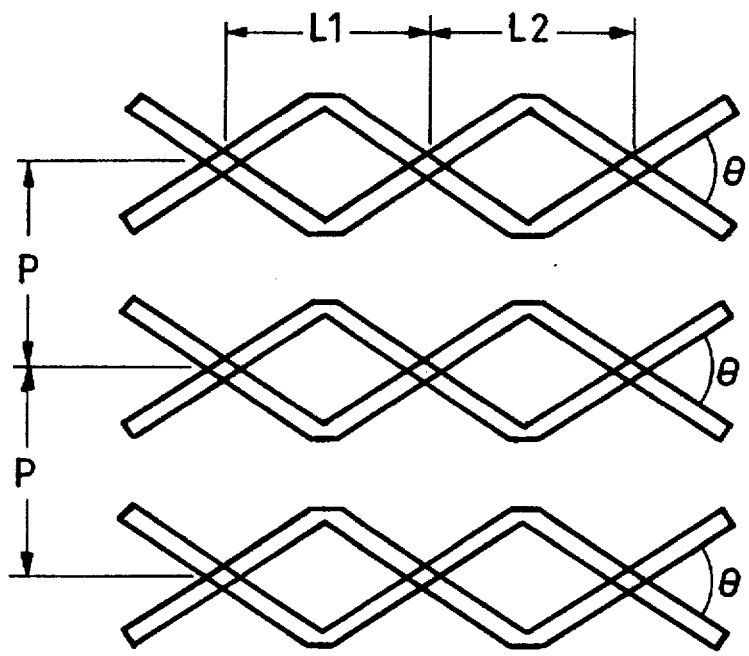
FIG. 12A is a plan view showing the arrangement of plural patterns according to the third embodiment.
Figure 12B:
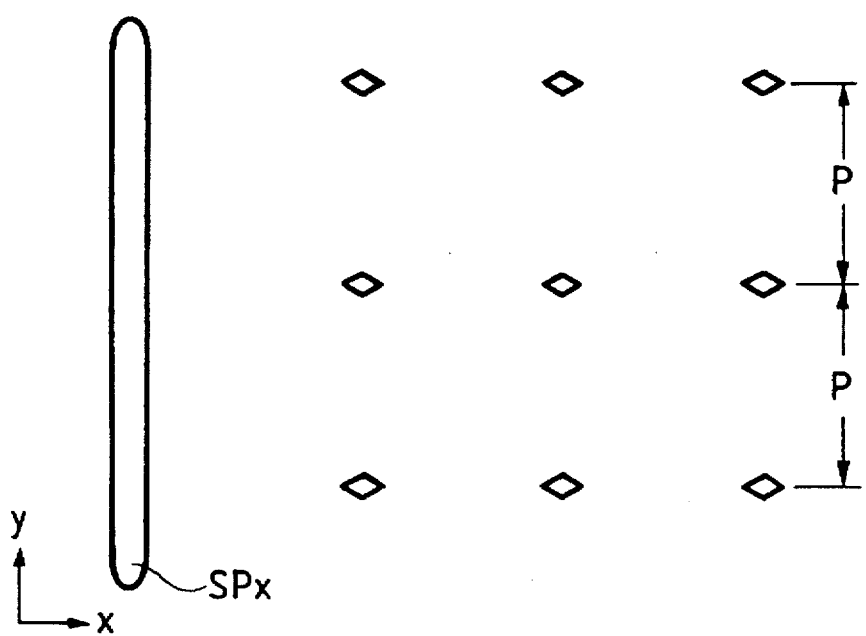
FIG. 12B is a plan view illustrating the wedge-shaped patterns formed by the patterns shown in FIG. 12A.

In the second and third embodiments, the descriptions have been made of only one set of patterns in one measurement direction, but as shown in FIG. 12A, for example, plural sets of patterns are arranged in the y direction with the predetermined widths of pitches P so that the wedge-shaped portions thereof can be of diffraction grating type at pitches P as shown in FIG. 12B. Then, these patterns may also be scanned relatively by the spot ray of light SPx. In this way, the diffracted light is generated from the patterns to make it possible to obtain the signal waveforms which are clearer than those obtainable in the case of the edge scattering rays of light.

Furthermore, in the above-mentioned embodiments, the TTL method which is implemented through the projection lens is employed for measuring the positions of the edge-shaped patterns. However, it may be possible to use a method which is implemented without intervention of the projection lens. Also, the kinds of the sensor used for detecting the positions are not limited to those using a laser spot light, and the measurement is possible such as by the use of an image processing. For example, it is possible to employ a microscope of the off-axis type whereby the measuring patterns can be detected using a broad band illumination. In this case, the wedge-shaped patterns are observed by a CCD camera, and the pattern intervals are obtained on the basis of the video signals from the CCD camera.

An exposure apparatus according to the fourth embodiment of the present invention will be described below with reference to the accompanying drawings. In this embodiment, the present invention is applied to a stepper for printing a pattern on a reticle onto a wafer by a step-and-repeat method.

Figure 13:
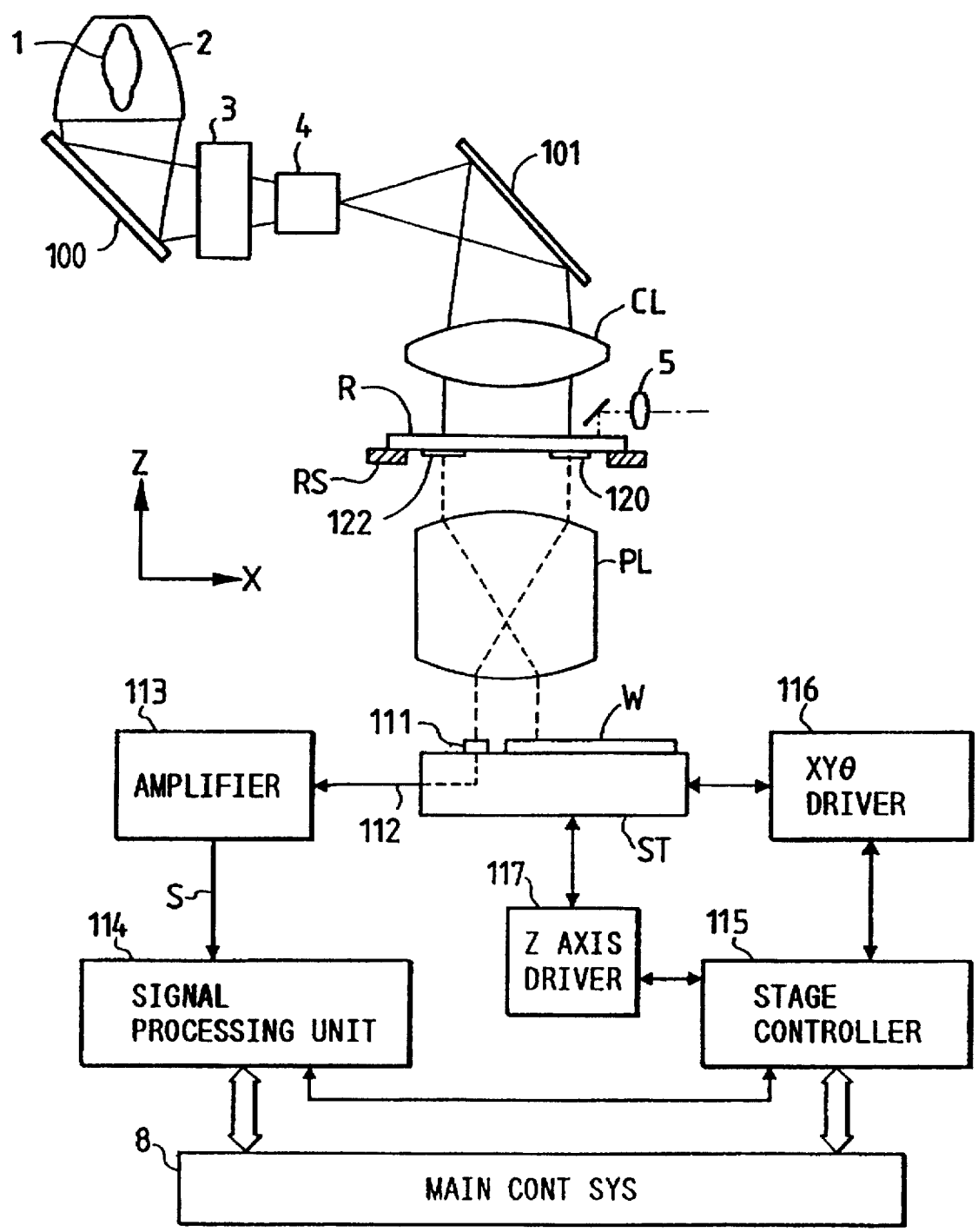
FIG. 13 is a diagram including a partial sectional view of an exposure apparatus according to a fourth embodiment of the present invention.

FIG. 13 shows an arrangement of the entire stepper of this embodiment. The same reference numerals in FIG. 13 denote the same parts as in FIG. 2. Exposure rays of exposure light (g line or i line) from a mercury lamp 1 are converged by an oval mirror 2, and converged light is reflected by a mirror 100. The reflected light is then incident on a mirror 101 via a shutter 3 for controlling the exposure amount and an optical integrator 4 for uniforming illuminating light. The exposure light reflected by the mirror 101 is converted into substantially collimated light by a main condenser lens CL, and illuminates a reticle R at a substantially uniform illuminance. A projection optical system PL is telecentric at both sides (or one side). When the orthogonal coordinates in a plane perpendicular to the optical axis of the projection optical system PL are represented by the X and Y axes, the reticle R is held on a reticle stage RS which can be finely moved in the directions of the X and Y axes, and can be finely rotated in the X-Y plane, and the reticle R is aligned with the apparatus (the optical axis of the projection optical system PL) by a reticle alignment system 5.

The reticle R of this embodiment is a test reticle for measuring a magnification error and a distortion amount of the projection optical system PL. Triangular-wave-like slit patterns 120 and 122 (to be described later) extending in the Y direction perpendicular to the plane of drawing of FIG. 13 are formed on a pattern area PA on the rear surface of the reticle R. These slit patterns 120 and 122 are used for measuring a magnification error, and the like in the X direction and slit patterns for measuring a magnification error and the like in the Y direction are also formed on the reticle R, although not shown.

A wafer W is held on a wafer stage ST. The wafer stage ST includes an X-Y stage which moves in the X-Y plane, a Z stage which moves in the Z direction as the optical axis direction of the projection optical system PL, a θ stage which is finely rotated in the X-Y plane, and the like. The wafer W is placed on the wafer stage ST. A photoelectric sensor 111 comprises a charge-coupled device (CCD) type line sensor elongated in the Y direction, and is fixed on the wafer stage ST at a position neighboring the wafer W, so that the light-receiving surface of the photoelectric sensor 111 is set at the same level as the exposure surface of the wafer W in the optical axis direction of the projection optical system PL. The wafer stage ST is driven in the optical axis direction, so that the imaging surface of the projection optical system PL coincides with the light-receiving surface of the photoelectric sensor 111 upon measurement of, e.g., a magnification. An image of the slit pattern 120 or 122, formed by the projection optical system PL, on the reticle R is projected onto the light-receiving surface of the photoelectric sensor 111. Note that the photoelectric sensor 111 is a sensor for measuring a magnification error and the like in the X direction, and a photoelectric sensor for measuring a magnification error and the like in the Y direction is arranged to extend in a direction perpendicular to the photoelectric sensor 111, although not shown.

Photoelectric conversion signals output from a series of light-receiving elements of the photoelectric sensor 111 are amplified by an amplifier 113 to obtain mark signals S, and the mark signals S are supplied to a signal processing unit 114. The signal processing unit 114 processes the mark signals S, and obtains the Y coordinates of the intersecting points between the light-receiving surface of the photoelectric sensor 111 and the image of the slit pattern 120 or 122. The signal processing unit 114 sends a command to a stage controller 115 to move the wafer stage ST in a predetermined measuring direction. An XY-θ driver 116 drives the X-Y stage and the θ stage which is rotated in the X-Y plane of the wafer stage ST, and a Z-axis driver 117 drives the Z stage of the wafer stage ST. Two sets of laser interferometers for measuring the X and Y positions of the wafer stage ST are arranged on the XY-θ driver 116, and an encoder for measuring the Z position of the wafer stage ST is arranged on the Z axis driver 117. The stage controller 115 detects the coordinates corresponding to, e.g., the optical axis of the projection optical system PL on the wafer stage ST and the height of the wafer stage ST with respect to the projection optical system PL on the basis of position data from the drivers 118 and 117, and aligns the wafer stage ST via the drivers 116 and 117 so that the coordinates and the height have predetermined values.

A main controlling system 8 controls the operation of the overall apparatus. The main controlling system 8 receives the coordinate value of the intersecting point obtained by the signal processing unit 114, and the position data of the wafer stage ST obtained by the stage controller 115. The main controlling system 8 systematically controls a measurement sequence of imaging characteristics (in particular, a magnification error and a distortion amount) of the projection optical system PL, controls the opening and closing timings of the shutter 3 through a shutter controller (not shown) in exposure, and finally obtains the magnification error and the distortion amount of the projection optical system PL. Although not shown in FIG. 13, the projection optical system PL of this embodiment consists of a plurality of lens groups, and its imaging characteristics can be changed by adjusting the interval between predetermined adjacent lens groups, and the inclination of the predetermined lens group with respect to the optical axis. The main controlling system 8 adjusts the interval between adjacent lens groups or the inclination of the lens group of the projection optical system PL, so that the obtained magnification error and the like of the projection optical system PL fall within corresponding allowable ranges. Furthermore, a space between predetermined adjacent lens groups of the projection optical system PL may be closed, and the pressure of a gas (e.g., air) in this closed space may be changed to change the imaging characteristics of the projection optical system PL.

Note that the imaging characteristics (in particular, a barrel distortion or pin-cushion distortion) of the projection optical system PL may be corrected by moving the reticle in the optical axis direction of the projection optical system PL or by inclining the reticle with respect to the X-Y plane. In this embodiment, a mechanism for correcting imaging characteristics may have an arbitrary arrangement.

A technique for changing the imaging characteristics of the projection optical system PL by moving some lens elements or the reticle is disclosed in U.S. Pat. No. 5,117,225. Also, a technique for closing a space between predetermined adjacent lens groups of the projection optical system PL, and changing the imaging characteristics of the projection optical system PL by changing the pressure of a gas (e.g., air) in the closed space is disclosed in U.S. Pat. No. 4,871,237.

Figure 14:
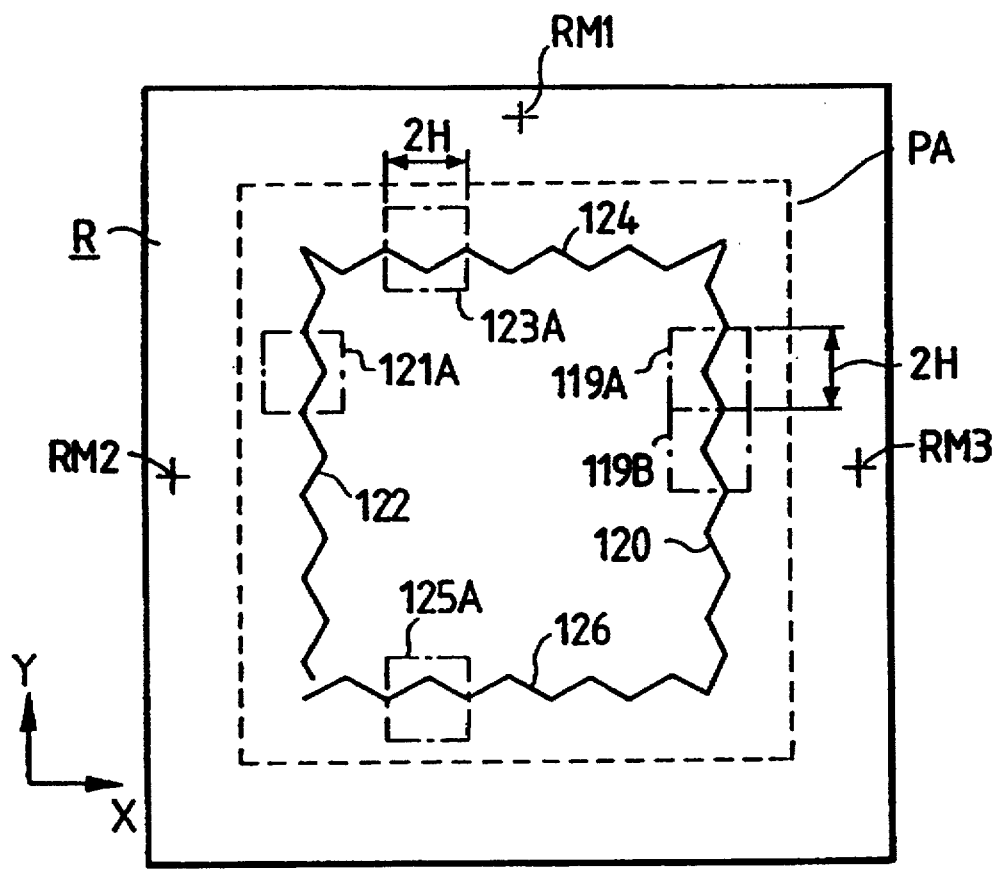
FIG. 14 is a plan view showing a pattern of a reticle R according to the fourth embodiment.

The pattern arrangement of the reticle R of this embodiment will be described below with reference to FIG. 14. In FIG. 14, cross-shaped reticle alignment marks RM1, RM2, and RM3 are formed near the three sides of the reticle R, and reticle R is aligned by detecting these marks RM1 to RM3 by the reticle alignment system 5 shown in FIG. 13. A rectangular pattern area PA is formed at the center of the reticle R with reference to these three marks RM1 to RM3. In this embodiment, the triangular-wave-like slit pattern 120 defined by repetitively forming a pattern unit 119A having a Y length of 2H in the Y direction is formed at the right end in the X direction of the pattern area PA, and the triangular-wave-like slit pattern 122 defined by repetitively forming a pattern unit 121A in the Y direction is formed at the left end of the pattern area PA. The slit patterns 120 and 122 are axial-symmetrical about a line passing the center of the reticle R and extending parallel to the Y axis. The interval between the central lines of the slit patterns 120 and 122 in the X direction is set to be a predetermined value, and is stored in a memory in the main controlling system 8. The magnification error, and the like in the X direction of the projection optical system PL are measured by the pair of slit patterns 120 and 122, which have their longitudinal directions in the Y direction.

Similarly, a triangular-wave-like slit pattern 124 defined by repetitively forming a pattern unit 123A having an X length of 2H in the X direction is formed at the upper end in the Y direction of the pattern area PA, and a triangular-wave-like slit pattern 128 defined by repetitively forming a pattern unit 125A in the X direction is formed at the lower end of the pattern area PA. The slit patterns 124 and 126 are axial-symmetrical about a line passing the center of the reticle R and extending parallel to the X axis. The interval between the central lines of the slit patterns 124 and 126 in the Y direction is set to be a predetermined value, and is stored in the memory in the main controlling system 8. The magnification error and the like in the Y direction of the projection optical system PL are measured by the pair of slit patterns 124 and 126, which have their longitudinal directions in the X direction. Note that the shape of the slit pattern 120, and the like is not limited to the triangular-wave-shape, and edge patterns and the like may be used in addition to the slit pattern 120 and the like.

Figure 15:
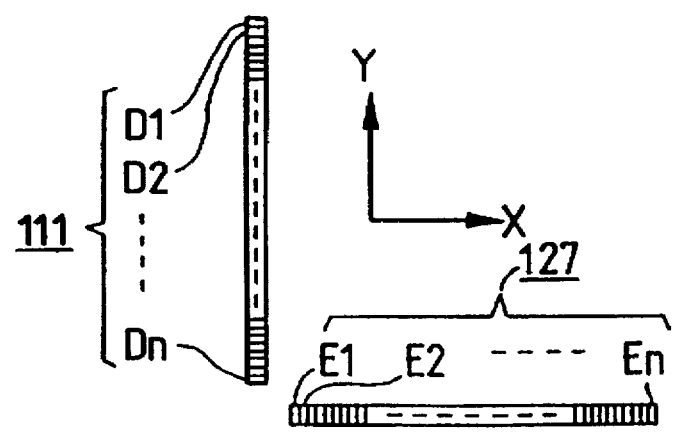
FIG. 15 is a plan view showing a photoelectric sensor 111, and the like shown in FIG. 13.

FIG. 15 shows the detailed structure of the photoelectric sensor 111 shown in FIG. 13. As shown in FIG. 15, the photoelectric sensor 111 is constituted by light-receiving elements D1 to Dn aligned in the Y direction. The Y length of each of light-receiving elements D1 to Dn, i.e., the Y positional resolution is, e.g., several µm, and the total Y length is about a length obtained by multiplying the Y length of the slit pattern 120 with an enlargement magnification (or a reduction magnification) of the projection optical system PL. In this case, when the method of moving the wafer stage ST in the Y direction is used, the Y length of the photoelectric sensor 111 may be about a length obtained by multiplying the Y length 2H of the pattern unit 119A on the reticle R with the magnification of the projection optical system PL. A photoelectric sensor 127 constituted by light-receiving elements E1 to En aligned in the X direction is arranged to extend in a direction perpendicular to the photoelectric sensor 111. Note that each of the photoelectric sensors 111 and 127 may be constituted by, e.g., a two-dimensional image sensor.

Figure 16:
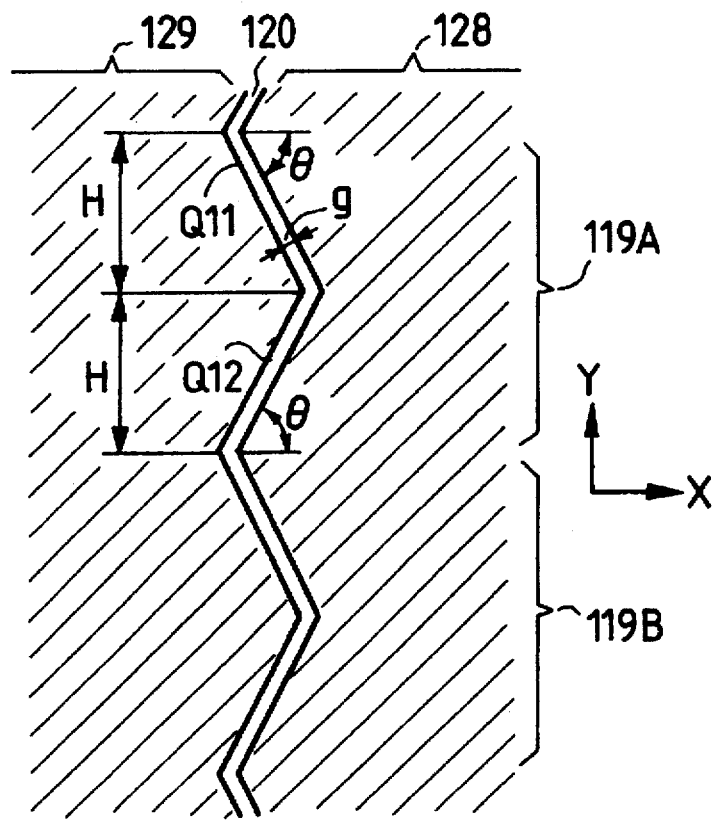
FIG. 16 is an enlarged plan view showing the details of a portion of a slit pattern 120 shown in FIG. 14.

FIG. 16 shows the detailed shapes of the pattern unit 119A on the reticle R (FIG. 14), and a pattern unit 119B adjacent thereto. In the pattern units 119A and 119B in FIG. 16, a light-shielding pattern 128 having a triangular-wave-like left edge, and a light-shielding pattern 129 having a triangular-wave-like right edge are arranged to be separated at a predetermined interval in the X-direction. Normally, these light-shielding patterns are formed by removing a chromium layer of portions corresponding to the pattern units 119 by etching in the manufacture of a reticle. Thus, the light-transmitting triangular-wave-like slit pattern 120 is formed between these light-shielding patterns 128 and 129. In the slit pattern 120, the pattern unit 119A is defined by connecting a slit Q11, which crosses the X direction as a measuring direction at an angle θ (0°<θ90°) in the clockwise direction, and has a width g, and a slit Q12, which crosses the X direction at the angle θ in the counterclockwise direction, and has a width g. The Y length perpendicular to the X direction of each of the slits Q11 and Q12 is H.

When the reticle R of this embodiment is used, magnification errors and the like of the projection optical system PL not only in the X direction but also in the Y direction can be measured. In the following description, a measuring method of a magnification error and the like in the X direction will be mainly explained.

Figures 17A, 17B:
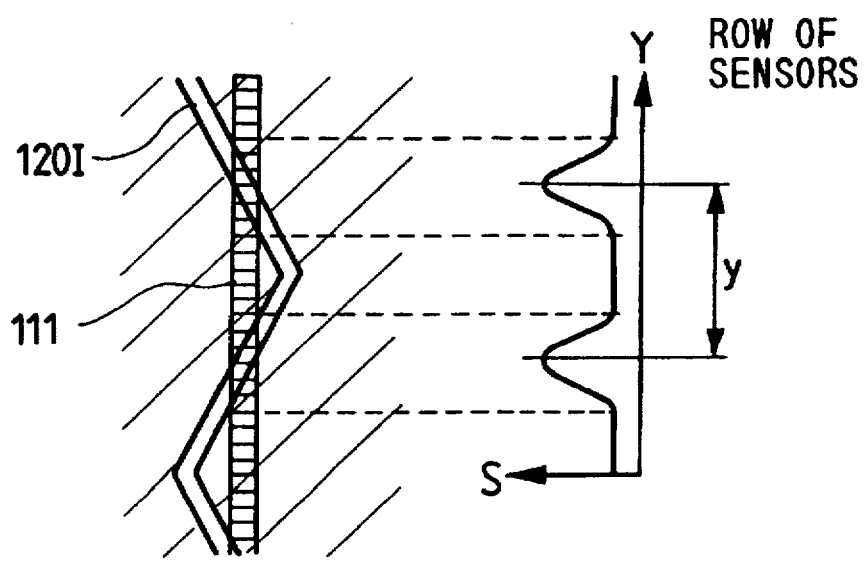
FIG. 17A is an enlarged plan view showing an image of the slit pattern formed on the photoelectric sensor 111.
FIG. 17B is a waveform chart showing a mark signal S output from the photoelectric sensor 111 in correspondence with the image.

FIG. 17A shows a state wherein the image of the slit pattern 120 in FIG. 16 is projected near the photoelectric sensor 111 on the wafer stage ST via the projection optical system PL. In FIG. 17A, a slit pattern image 120I with a high illuminance is the image of the slit pattern 120. In this case, when mark signals S obtained from the series of light-receiving elements of the photoelectric sensor 111 are plotted in correspondence with their Y positions, only the mark signals S obtained from the light-receiving elements of the photoelectric sensor 111 corresponding to a portion crossing the slit pattern image 120I have large values, as shown in FIG. 17B. A Y interval y of two adjacent peaks of the mark signals S can be considered as the Y interval between adjacent intersecting points of the slit pattern image 120I and the photoelectric sensor 111. In this manner, according to this embodiment, the Y interval between the intersecting points of the slit pattern image 120I and the photoelectric sensor 111 can be easily measured on the basis of the mark signals.

A change in measurement result obtained when the relative position between the slit pattern image 120I and the photoelectric sensor 111 changes due to, e.g., a magnification error of the projection optical system PL will be described below with reference to FIGS. 18A and 18B.

Figures 18A, 18B:
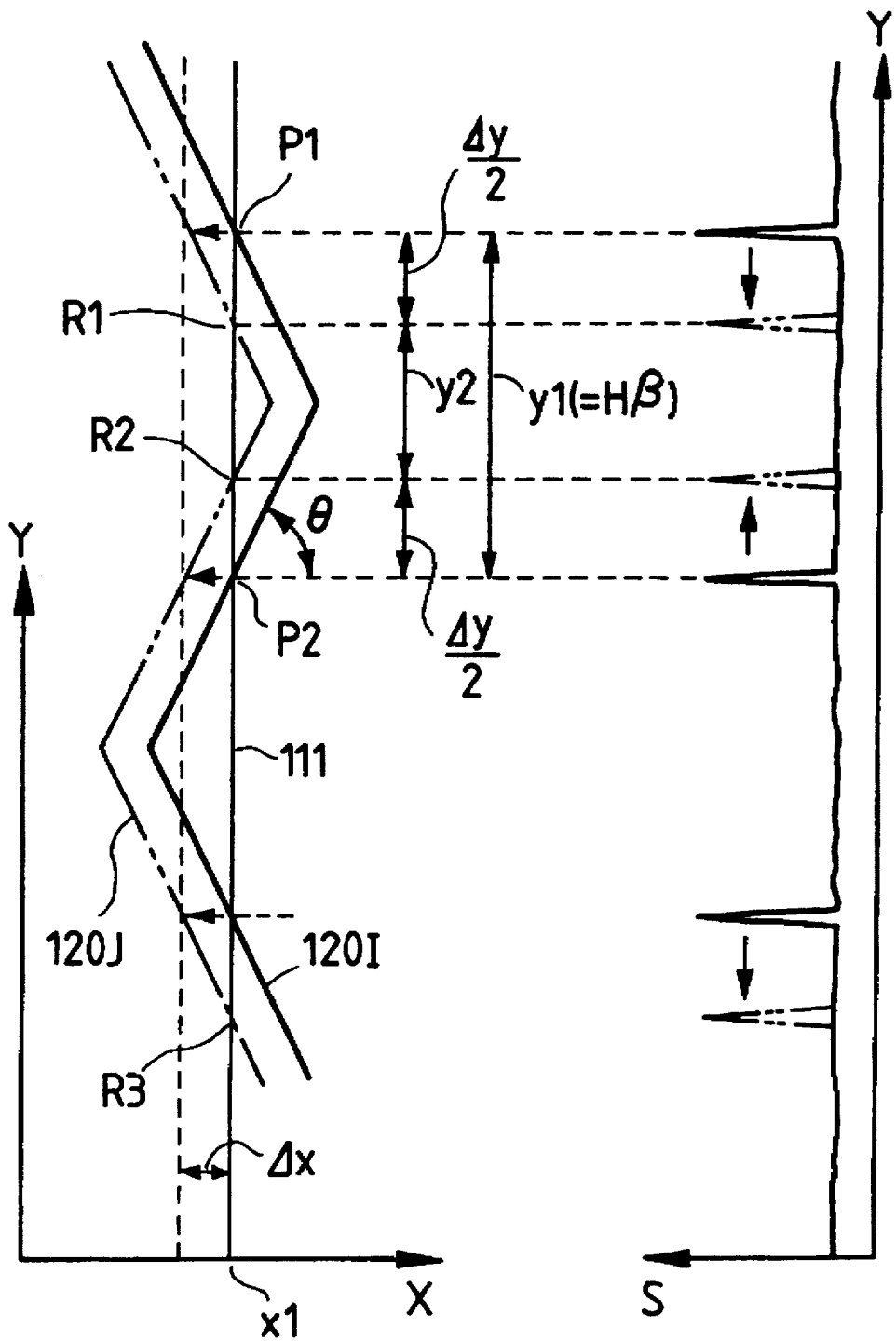
FIG. 18A is a plan view showing a case wherein the position of a slit pattern image 120I is deviated with respect to the photoelectric sensor 111.
FIG. 18B is a waveform chart showing a change in mark signal S corresponding to the deviation.

In FIG. 18A, the X coordinate of the photoelectric sensor 111 is represented by x1, and a slit pattern image obtained when the magnification of the projection optical system PL has a designed value is represented by 120I. As shown in FIG. 18B, since the mark signal S has a peak value at the intersecting point between the slit pattern image 120I and the photoelectric sensor 111, the Y position of the intersecting point can be detected. A Y interval between adjacent intersecting points P1 and P2 of the slit pattern image 120I and the photoelectric sensor 111 is represented by y1. When the X coordinate of the central line of the slit pattern image 120I is x1, if the magnification of the projection optical system PL is represented by $\beta$, the interval y1 is equal to H$\beta$. In contrast to this, assume that the slit pattern image 120I is deviated by $\Delta x$ in the X direction due to a change in magnification of the projection optical system PL, and an image 120J is formed. If a Y interval between adjacent intersecting points R1 and R2 of the deviated image 120J and the photoelectric sensor 111 is represented by y2, the intervals y1 and y2 can be measured in this embodiment.

When the measured positional deviation in the Y direction is represented by $\Delta y$, the following equation is established:

$$\Delta y = y1 - y2 \qquad (8)$$

In this case, since the angle defined between the images 120I and 120J and the X direction is $\theta$, the actual positional deviation $\Delta x$ in the X direction can be calculated from the measured positional deviation $\Delta y$ using the following equation:

$$\Delta x = (\Delta y/2)/\tan \theta \qquad (9)$$

According to equation (9), if $\theta > 27°$, $\Delta x < \Delta y$ is satisfied. This means that the positional deviation $\Delta x$ of the slit pattern image in the X direction due to the magnification error can be enlarged to $\Delta y$, and $\Delta y$ can be measured when the angle $\theta$ defined between the slit pattern 120 (FIG. 16) and the X direction as the measuring direction is set to be larger than 27°. For example, when $\theta = 79°$ is set, $\Delta y = 10 \Delta x$, and the positional deviation $\Delta x$ can be observed in an enlarged scale of about 10 times.

Therefore, according to this embodiment, the relative positional relationship between the slit pattern image 120I as a reference mark and the photoelectric sensor 111 can be directly enlarged and observed without using an enlargement optical system.

In this case, since only the interval y2 in FIG. 18A is actually measured in a given projection optical system PL, H$\beta$ as a value of an ideal slit pattern image under an assumption that the X coordinate of the image center coincides with x1 may be used as y1 of equation (8). Thus, $\Delta y$ can be considered as a positional deviation in the X direction from an ideal state.

In some cases, the Y magnification of the projection optical system PL may deviate from $\beta$. Such a local error may be detected as follows. More specifically, in FIG. 18A, if the third intersecting point following the intersecting points R1 and R2 of the deviated slit pattern image 120J and the photoelectric sensor 111 is represented by R3, the interval between the intersecting points R1 and R3 is 2H·$\beta$ in a state free from any Y magnification error. In contrast to this, if the actually measured interval is represented by y3, a local Y magnification error $\Delta \beta_Y$ can be calculated by the following equation:

$$\Delta \beta_Y = (y3 - 2H \cdot \beta)/(2H \cdot \beta) \qquad (10)$$

When $\Delta y$ obtained from the above-mentioned equation (8) is corrected in consideration of the magnification error calculated in this manner, the X positional deviation can be more accurately calculated.

A method of calculating a magnification error, and the like in the X direction of the projection optical system PL on the basis of the X positional deviation $\Delta x$ calculated from equation (9) will be explained below with reference to FIG. 19. For the sake of simplicity, assume that there is no Y magnification error.

Figure 19:
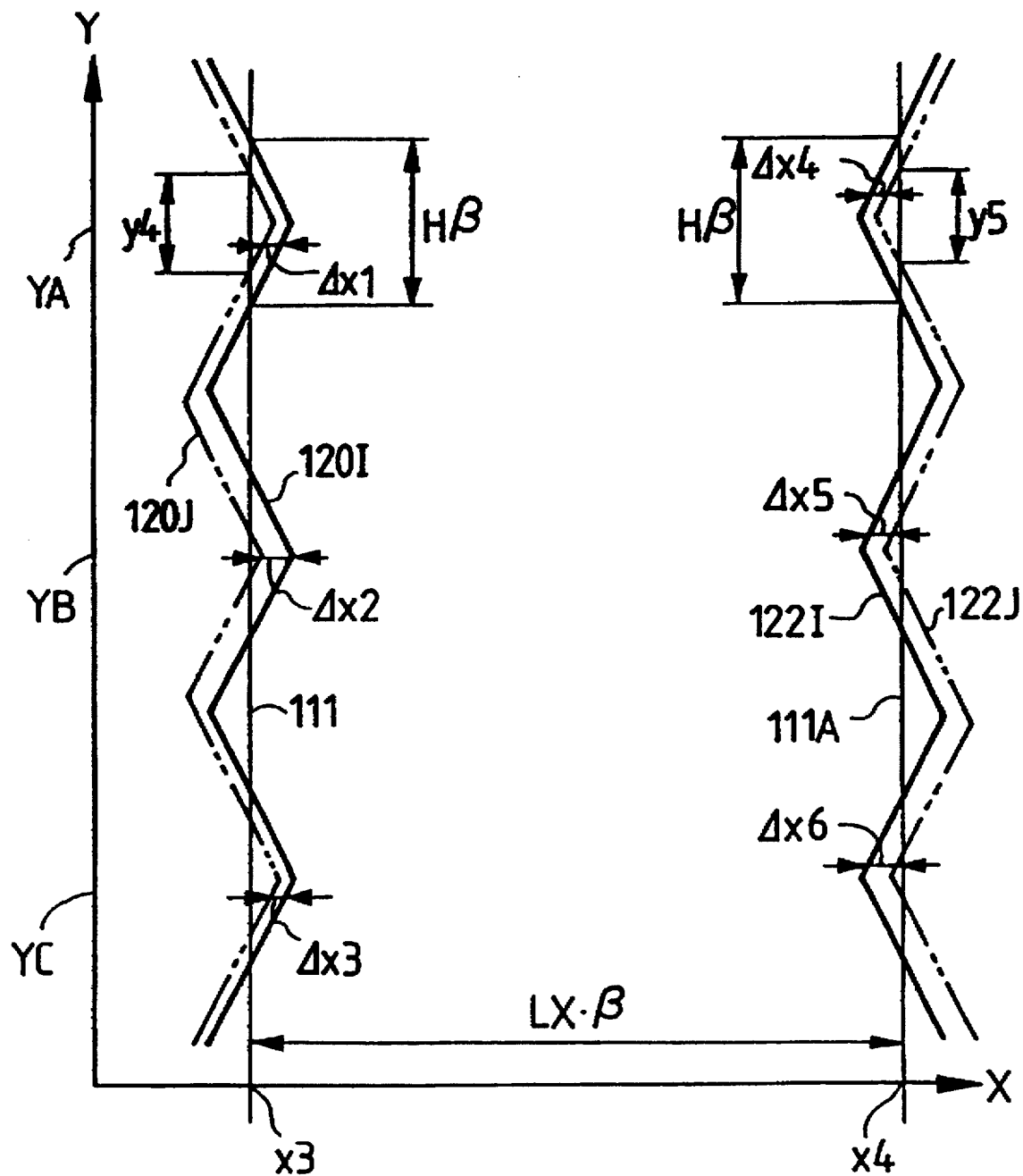
FIG. 19 is a graph for explaining a method of obtaining a magnification error or a distortion amount of a projection optical system.

In FIG. 19, images 120I and 122I indicated by solid lines are imaginary projection images of the slit patterns 120 and 122 on the reticle shown in FIG. 14 when the X magnification of the projection optical system PL has a design value (assumed to be $\beta$). Images 120J and 122J indicated by alternate long and two short dashed lines are assumed to be actual projection images of the slit patterns 120 and 122 by the projection optical system PL. In this case, the main controlling system 8 shown in FIG. 13 moves the wafer stage ST in the X direction through the stage controller 115, and performs measurements at two positions where the X coordinates of the photoelectric sensor 111 are x3 and x4. The photoelectric sensor 111 having an X coordinate=x4 is represented by 111A.

If the interval between the central lines of the slit patterns 120 and 122 on the reticle R (FIG. 14) is represented by LX, the interval between the X coordinates x3 and x4 is selected to satisfy LX·$\beta$. In this case, the X coordinates of the central lines of the imaginary slit pattern images 120I and 122I can be considered as x3 and x4. Near a Y coordinate YA in FIG. 19, an interval y4 between the two intersecting points of the photoelectric sensor 111 and the actual slit pattern image 120J, and an interval y5 between two intersecting points of the photoelectric sensor 111A and the actual slit pattern image 122J are measured. The interval between two intersecting points of the imaginary slit pattern image 120I and the photoelectric sensor 111, and the interval between two intersection points of the imaginary slit pattern image 122I and the photoelectric sensor ilia are H·$\beta$.

An X positional deviation $\Delta x1$ of the slit pattern image 120J is calculated by substituting in equation (9) $\Delta y$ obtained by substituting the interval y4 and H·$\beta$ in equation (8), and an X positional deviation $\Delta x4$ of the slit pattern image 122J is calculated by substituting in equation (9) $\Delta y$ obtained by substituting the interval y8 and H·$\beta$ in equation (8). Therefore, if an X magnification error near the Y coordinate YA is represented by $\Delta \beta_{X1}$, $\Delta \beta_{X1}$ is given by:

$$\Delta \beta_{X1} = (LX \cdot \beta + \Delta x1 + \Delta x4)/LX - \beta \qquad (11)$$
$$= (\Delta x1 + \Delta x4)/LX$$

Similarly, near a Y coordinate YB, a positional deviation $\Delta x2$ of the actual slit pattern image 120J, and a positional deviation $\Delta x5$ of the actual slit pattern image 122J are obtained, and near a Y coordinate YC, a positional deviation $\Delta x3$ of the actual slit pattern image 120J, and a positional deviation $\Delta x6$ of the actual slit pattern image 122J are obtained. Then, X magnification errors $\beta \oplus_{X2}$ and $\Delta \beta_{X3}$ near the Y coordinates YB and YC are calculated using substantially the same equations as equation (11). A difference between the magnification errors $\Delta \beta_{X1}$ and $\Delta \beta_{X2}$ and a difference between the magnification errors $\Delta \beta_{X2}$ and $\Delta \beta_{X3}$ can be respectively considered as local distortions of the projection optical system PL.

As described above, according to this embodiment, the coordinates of the intersecting points of the photoelectric sensor 111 with the slit pattern images 120J and 122J need only be measured by moving the photoelectric sensor 111 to two positions where the X coordinates are x3 and x4, thereby quickly measuring the magnification errors and distortion amounts in the X direction of the projection optical system PL. Therefore, since the photoelectric sensor 111 need not be scanned in the X direction, the measurement time can be greatly shortened. Furthermore, the X positional deviations of the slit pattern images 120J and 122J can be measured in an enlarged scale by only setting the angle θ defined between the slit patterns 120 and 122 on the reticle R and the X direction to be larger than a predetermined value, and the magnification errors and the like can be measured with higher precision.

In this embodiment, since the photoelectric sensor 111 has only one light-receiving portion in the X direction, it must be moved to two X positions (coordinates x3 and x4) in order to detect the images of the slit patterns 120 and 122. However, when the photoelectric sensor 111 is arranged with two light-receiving portions in the X direction, the images of the slit patterns 120 and 122 can be detected at one X position. More specifically, the former requires position data output from interferometers, but the latter performs measurements with reference to the pixels of the photoelectric sensor 111.

On the reticle R in FIG. 14, for example, the slit pattern 120 is defined by repetitively forming a large number of pattern units 119A, and the slit pattern 122 is defined by repetitively forming a large number of pattern units 121A. However, even when only the pattern units 119A and 121A are formed on the reticle R, a magnification error of the projection optical system PL near the Y coordinate YA in FIG. 19 can be measured. When only the pattern units 119A and 119B in FIG. 14 are formed on the reticle R, the positional deviations Δx4 and Δx5 in FIG. 19 can be measured. Therefore, the distortion of the projection optical system PL near these patterns can be measured based on a difference between the two deviations. Therefore, when a plurality of patterns which are the same as the pattern unit 119A are present on the reticle R (FIG. 14), a magnification error, and the like of the projection optical system PL can be measured to some extent regardless of the arrangement of these patterns.

When the slit pattern 120 on the reticle R (FIG. 14) is used, since the wafer W can be brought to an in-focus position with respect to the projection optical system PL, this will be described below with reference to FIGS. 20A to 21B.

Figures 20A, 20B:
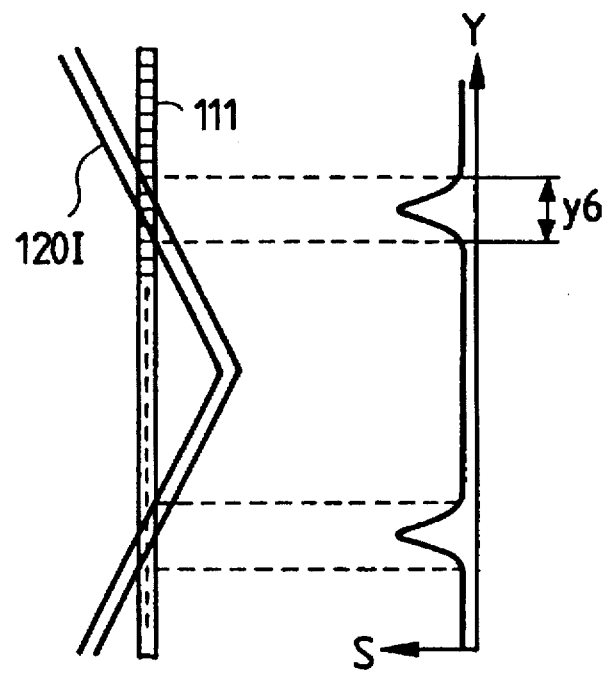
FIG. 20A is an enlarged plan view showing the slit pattern image 120I obtained when the light-receiving surface of the photoelectric sensor 111 is at an in-focus position with respect to the projection optical system.
FIG. 20B is a waveform chart showing the mark signal S corresponding to the image.

FIG. 20A shows a state wherein the light-receiving surface of the photoelectric sensor 111 coincides with the imaging plane of the projection optical system PL, i.e., a state wherein the light-receiving surface is at an in-focus position with respect to the projection optical system PL. In this case, the image 120I of the slit pattern 120 on the reticle R has the narrowest line width. The mark signal S obtained from the photoelectric sensor 111 has a pulse shape in a Y width y6 in an intersecting area between the slit pattern image 120I and the photoelectric sensor 111, as shown in FIG. 20B.

Figures 21A, 21B:
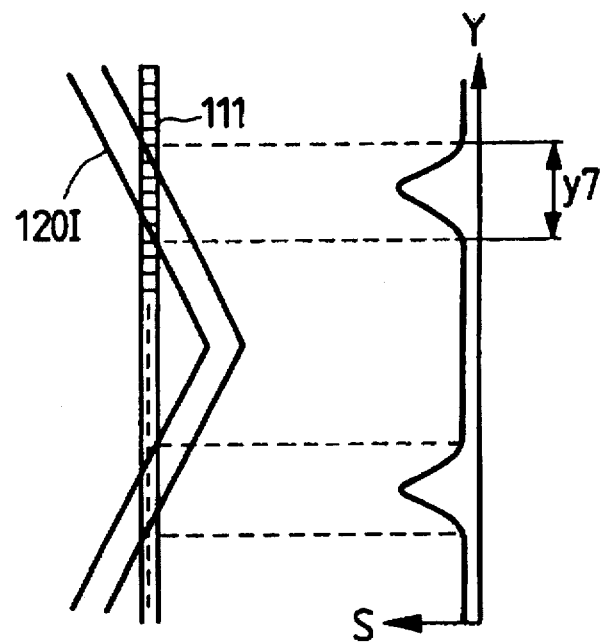
FIG. 21A is an enlarged plan view showing the slit pattern image 120I obtained when the light-receiving surface of the photoelectric sensor 111 is deviated from the focal plane of the projection optical system.
FIG. 21B is a waveform chart showing the mark signal S corresponding to the image.

In contrast to this, when the light-receiving surface of the photoelectric sensor 111 is deviated upward or downward from the in-focus position with respect to the projection optical system PL, the width of the image 120I on the photoelectric sensor 111 of the slit pattern 120 on the reticle R is increased, as shown in FIG. 21A. A width y7 of the pulse portion of the mark signal S obtained from the photoelectric sensor 111 becomes wider than the width y6 in FIG. 20B, as shown in FIG. 21B. Therefore, the height of the wafer stage ST is adjusted to obtain the narrowest Y width of the intersecting area of the photoelectric sensor 111 and the pattern image 120I, thereby bringing the light-receiving surface of the photoelectric sensor 111 to an in-focus position with respect to the projection optical system PL.

In this case, when the Y width of the slit pattern 120 on the reticle R is represented by $g_Y$, and the magnification of the projection optical system PL is represented by $\beta$, the narrowest pulse width y6 in the Y direction obtained from the mark signal S in FIG. 20B is about $g_Y \beta$. When a change in pulse width is measured in advance by vertically moving the wafer stage ST from an in-focus state, a positional deviation between the in-focus point and the present Z coordinate can be calculated from the present pulse width (e.g., the width y7 in FIG. 21B). Then, the focusing speed can be increased by moving the wafer stage ST by the calculated positional deviation.

When the slit pattern 120, and the like of this embodiment are used, a focusing operation for the projection optical system PL can be performed in addition to measurements of the magnification errors and the like of the projection optical system PL. In this case, the focusing operation is directly performed using an image obtained by projecting the pattern on the reticle onto the light-receiving surface of the photoelectric sensor 111 via the projection optical system PL. For this reason, even when the imaging characteristics of the projection optical system PL change due to aging or absorption of exposure light, and an in-focus plane (best imaging plane) is deviated in the Z direction, the true in-focus point (best focus position) can be accurately detected. At this time, when the best focus positions for a plurality of points in an image field of the projection optical system PL are obtained, the best imaging plane of the projection optical system PL can also be obtained.

Although not shown in FIG. 13, an indirect focusing mechanism may be provided for the apparatus. Unlike in a direct method for detecting an actual imaging plane of the projection optical system PL, and causing the exposure surface of the wafer W to coincide with the detected imaging plane, in an indirect method, the Z coordinate of the imaging plane is obtained by the direct method, and thereafter, the height of the wafer stage ST is controlled so that the Z coordinate of the exposure surface of the wafer W becomes equal to the obtained coordinate. When the wafer W is present in the image field of the projection optical system PL, since it is relatively difficult to perform a direct focusing operation, an indirect focusing operation is performed. As an optical system for the indirect focusing operation, an optical system in which a light beam is obliquely incident with respect to the optical axis of the projection optical system PL, and the light beam obliquely reflected by the wafer W is received by a position-detection type light-receiving element (e.g., a PSD) is used.

When the indirect focusing operation is performed, the imaging plane position of the projection optical system PL must be calibrated by the direct focusing operation. Since the focusing method using the slit pattern 120 of this embodiment is a direct method, it is suitable for periodically calibrating the in-focus point of the indirect focusing mechanism. Since the arrangement of the indirect focusing mechanism and its calibration operation are disclosed in, e.g., U.S. Pat. No. 4,850,983, a detailed description thereof will be omitted.

The fifth embodiment of the present invention will be described below with reference to FIGS. 22A and 22B.

Figure 22A:
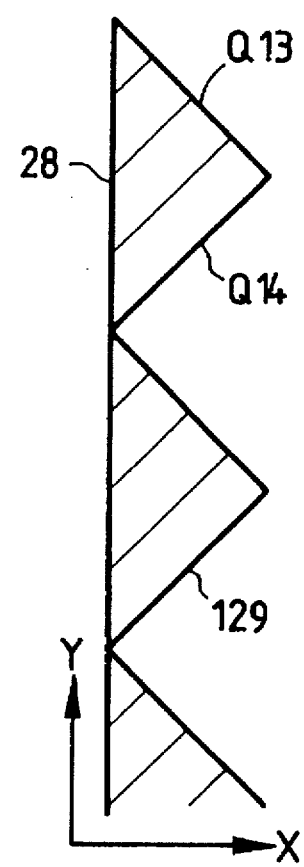
FIG. 22A is an enlarged plan view of main part showing a pattern on a reticle R according to the fifth embodiment of the present invention.

FIG. 22A Shows a pattern on a reticle R of this embodiment. In FIG. 22A, a light-shielding pattern 128 has a triangular-wave-like right edge. When a pair of neighboring edge patterns Q13 and Q14 at the right end of the light-shielding pattern 128 are repetitively formed in the Y direction, a triangular-wave-like edge pattern 129 is formed. When an image of this edge pattern 129 is projected onto the light-receiving surface of the photoelectric sensor 111 (FIG. 15) through the projection optical system PL, and a Y coordinate of a boundary between bright and dark portions of the edge pattern image is detected, widths corresponding to intervals y1 and y2 in FIGS. 18A and 18B are obtained. Therefore, the magnification errors, and the like in the X direction of the projection optical system PL can be measured.

In FIG. 22A, the neighboring edge patterns Q13 and Q14 are inclined with respect to the X axis. Also, one of the edge patterns may be parallel to the X axis. FIG. 22B shows a pattern on the reticle R in this case. In FIG. 22B, a light-shielding pattern 130 is defined by repetitively forming a right triangle in the Y direction. One edge pattern Q15 of a pair of neighboring edge patterns of this light-shielding pattern 130 is parallel to the X axis, and the other pattern Q16 crosses the X axis at an angle θ. When the pair of edge patterns Q15 and Q16 are repetitively formed in the Y direction, a sawtooth-like edge pattern 131 is formed. The magnification errors and the like in the X direction of the projection optical system PL can be similarly measured by calculating the Y coordinate of a boundary portion between bright and dark portions of the image of the edge pattern 131.

Figure 22B:
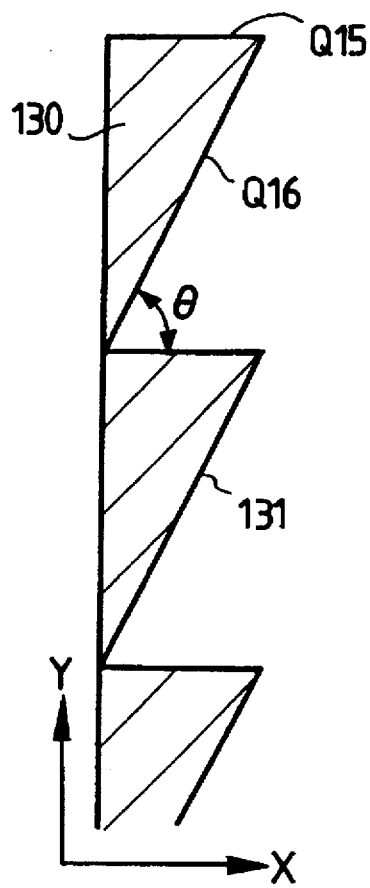
FIG. 22B is an enlarged plan view of main part showing a modification of the pattern shown in FIG. 22A.

In FIG. 22B, the relationship between an X positional deviation Δx and an actually measured Y positional deviation Δy is as follows:

$$\Delta x = \Delta y / \tan \theta \qquad (12)$$

Upon comparison of this equation with equation (9), in this embodiment, the detection sensitivity is ½, while if θ>45°, Δx<Δy. Therefore, when the crossing angle of the other edge pattern Q16 with the X axis is set to be 45° or more, the positional deviation can be measured in an enlarged scale.

Figure 23A:
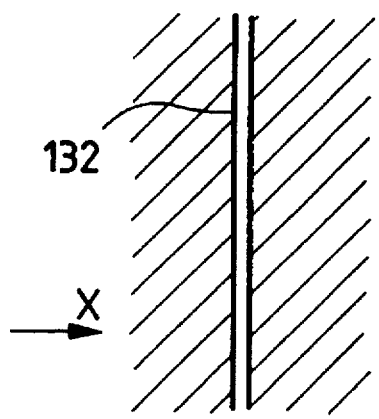
FIG. 23A is an enlarged plan view partially showing a pattern on a reticle R according to the sixth embodiment of the present invention.
Figure 23B:
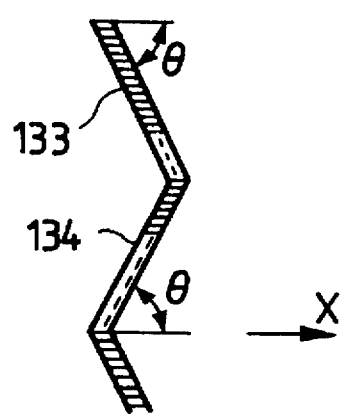
FIG. 23B is an enlarged plan view partially showing the shape of a light-receiving surface of a photoelectric sensor of the sixth embodiment.

In the embodiment described above, the pattern on the reticle R has a triangular-wave shape or a sawtooth-wave shape, and the light-receiving surface of the photoelectric sensor 111 is linearly formed. However, the pattern on the reticle R and the light-receiving surface may have a relationship opposite to that described above. In this case, a light-transmitting linear pattern 132 substantially perpendicular to the X direction is formed between light-shielding patterns, as shown in FIG. 23A, as a pattern on the reticle R, which pattern has the X direction as the measuring direction. On the other hand, the shape of the light-receiving surface of the photoelectric sensor placed on the wafer stage ST is defined by repetitively arranging in the Y direction a basic unit consisting of a line sensor 133 crossing the X direction at an angle θ in the clockwise direction, and a line sensor 134 crossing the Z direction at the angle θ in the counterclockwise direction, as shown in FIG. 23B. With this combination, the magnification errors, and the like in the X direction of the projection optical system PL can be measured.

Furthermore, the pattern on the reticle R may be formed as a triangular-wave-like slit pattern extending in the Y direction, as shown in FIG. 16, and the shape of the light-receiving surface of the photoelectric sensor can also have a triangular-wave-like slit pattern extending in the Y direction, as shown in FIG. 23B. In this case, the image of the slit pattern on the reticle R and the pattern of the light-receiving surface of the photoelectric sensor are set to have a phase difference of 180° therebetween. Thus, the relation given by equation (9) above is rewritten as follows, and an X positional deviation can be measured in a x2 enlarged scale.

$$\Delta x = (\Delta y/4)/\tan \theta \qquad (13)$$

In each of the above embodiments, the imaging characteristics (the magnification, distortion, focal point, and the like) of the projection optical system applied to the exposure apparatus are obtained. The present invention may be applied to a projection optical system of an apparatus other than the exposure apparatus so as to obtain the same effects described above. More specifically, an apparatus to which the projection optical system to be tested is applied is not limited, and the type of the projection optical system is not limited, either. For example, the projection optical system may comprise a refraction optical system consisting of a plurality of lens elements, a reflection optical system consisting of mirrors and the like, or a combination of these optical systems.

In each of the above embodiments, a test reticle is used. However, a slit pattern may be formed on a portion of a device reticle, and the patterns may be simultaneously measured. This method is particularly effective for a multi-die circuit (a plurality of circuit patterns are formed in a pattern area of the reticle).

Furthermore, a pair of slit patterns consisting of the unit patterns 119A and 125A (FIG. 14) may be formed at each lattice point obtained by dividing a pattern area of a reticle into a lattice pattern at a fine pitch. Thus, X and Y magnifications, and the like at substantially the same position can be measured. At this time, a plurality of light-receiving surfaces are preferably formed on the sensor 111 at corresponding positions. With this arrangement, the photoelectric sensor need not be scanned, and the measurement time can be shortened. The slit on the sensor 111 may be defined by a T-shaped pattern, i.e., a pair of linear patterns perpendicular to each other. In this case, the sensor 111 must be moved in the image field of the projection optical system. Moreover, a slit pattern consisting of the unit patterns 119A, 125A, 121A, and 123A (FIG. 14) may be formed at each lattice point obtained by dividing the reticle into a lattice pattern. Thus, the measurement precision can be improved.

When the focal point position of the projection optical system is to be detected, a mark may be arranged, so that the measuring direction coincides with a sagittal (S) or meridional (M) direction. Thus, an astigmatism can be obtained. The sensor 111 may comprise a sensor other than a CCD.

The present invention is not limited to the above-mentioned embodiments, and various other arrangements may be adopted without departing from the scope of the invention.

What is claimed is:

1. A projection exposure apparatus for transferring a pattern at a predetermined position onto a substrate surface via a projection optical system, comprising:

a member having a surface disposed at said predetermined position and a test pattern formed on that surface, said test pattern including a pair of line segments which are arranged obliquely with respect to a predetermined measuring direction and which are not parallel to each other;

light-receiving means extending in a second direction substantially perpendicular to said measuring direction, and having a light-receiving surface arranged at or nearly at the same position along an optical axis of said projection optical system as said substrate surface, for detecting an interval in said second direction between parts of an image of said test pattern projected by said projection optical system that correspond to said line segments; and arithmetic means for calculating an image deviation in said measurement direction based on the detected interval.

2. An apparatus according to claim 1, wherein said arithmetic means calculates said deviation by comparing the detected interval and a reference value.

3. An apparatus according to claim 1, wherein said arithmetic means is calculates a magnification error or a distortion of said projection optical system based on said deviation.

4. An apparatus according to claim 1, wherein said test pattern includes a pattern portion having a predetermined width, said light-receiving means detects a width of an image of said pattern portion, and said arithmetic means calculates a focal point position of said projection optical system based on the detected width.

5. A measuring method for an exposure apparatus which has a light source for emitting illumination light, an illumination optical system for illuminating a mask with said illumination light, a projection optical system for projecting an image of a pattern of the mask on a resist layer of a photosensitive substrate, a stage for holding said substrate and being movable along a first direction and a second direction substantially perpendicular to said first direction, said method comprising the steps of:

providing as said mask, a mask having a first mark pattern including at least two linear pattern portions which are non-parallel with respect to each other and obliquely oriented with respect to said first direction, and a second mark pattern displaced from said first mark pattern by a predetermined distance in said first direction and having at least one linear pattern portion oriented in said second direction;

projecting an image of said first mark pattern on said resist layer of said photosensitive substrate;

moving said stage in said first direction by a distance corresponding to said predetermined distance and projecting an image of said second mark pattern on said resist layer of said photosensitive substrate so as to form at least one pair of wedge-shaped resist images by overlapping parts of a resist image of said pattern portions of said first mark pattern with parts of a resist image of said pattern portion of said second mark pattern;

measuring an interval in said second direction between said pair of wedge-shaped resist images; and obtaining a difference between said measured interval and a predetermined standard value of the interval.

6. A measuring method according to claim 5, further comprising a step of calculating, based on said difference and an intersecting angle of the resist images of said second mark pattern and said first mark pattern, an amount of a positional deviation generated when said parts of said resist images are overlapped.

7. A measuring method according to claim 6, wherein a direction of said positional deviation is substantially perpendicular to the direction in which said stage is moved.

8. A measuring method for an exposure apparatus which has a light source for emitting illumination light, an illumination optical system for illuminating a mask with said illumination light, a projection optical system for projecting an image of a pattern of the mask on a resist layer of a photosensitive substrate, a stage for holding said substrate and being movable along a first direction and a second direction substantially perpendicular to said first direction, said method comprising the steps of:

providing, as said mask, a mask having a first mark pattern including first and second pairs of linear pattern portions, the pattern portions of each pair being non-parallel with respect to each other and being arranged obliquely and substantially symmetrically with respect to a straight line in said first direction, and a second mark pattern displaced from said first mark pattern by a predetermined distance in said first direction and including a pair of substantially parallel linear pattern portions oriented in said second direction, said first and second pairs of pattern portions of said first mark pattern being substantially symmetrically disposed with respect to a straight line in said second direction;

projecting an image of said first mark pattern on said resist layer of the photosensitive substrate;

moving said stage in said first direction by a distance corresponding to said predetermined distance and projecting an image of said second mark pattern on said resist layer so as to form at least two pairs of wedge-shaped resist images by overlapping parts of a resist image of said pattern portions of said first mark pattern with parts of a resist image of said pattern portions of said second mark pattern;

measuring respective intervals in said second direction between the wedge-shaped resist images of each said pair of resist images; and obtaining a difference between the measured intervals.

9. A measuring method according to claim 8, further comprising the step of calculating, based on said difference and an intersecting angle of the resist images of said second mark pattern and said first mark pattern, an mount of a positional deviation generated when said parts of said resist images are overlapped.

10. A measuring method for an exposure apparatus which has a light source for emitting illumination light, an illumination optical system for illuminating a mask with said illumination light, a projection optical system for projecting an image of a pattern of the mask on a resist layer of a photosensitive substrate, a stage for holding said substrate and being movable along a first direction and a second direction substantially perpendicular to said first direction, said method comprising the steps of:

providing, as said mask, a mask having a first mark pattern includes first, second and third linear pattern portions, with said first and second pattern portions being arranged obliquely and substantially symmetrically with respect to a first straight line in said first direction and said second and third pattern portions being arranged obliquely and substantially symmetrically with respect to a second straight line in said first direction, and a second mark pattern displaced from said first mark pattern by a predetermined distance in said first direction and having linear pattern portions corresponding to said pattern portions of said first mark pattern and disposed at a predetermined angle relative to the corresponding pattern portions;

projecting an image of said first mark pattern on said resist layer of the photosensitive substrate moving said stage in said first direction by a distance corresponding to said predetermined distance and projecting an image of said second mark pattern on said resist layer so as to form three wedge-shaped resist images by overlapping parts of a resist image of said pattern portions of said first mark pattern with parts of a resist image of the corresponding pattern portions of said second mark pattern;

measuring intervals in said second direction between adjacent pairs of said wedge-shaped resist images; and obtaining a difference between the measured intervals.

11. A measuring method according to claim 10, further comprising the step of calculating, based on said difference and an intersecting angle of the resist images of said second mark pattern and said first mark pattern, an amount of positional deviation generated when said parts of said resist images are overlapped.

12. A measuring method according to claim 11, wherein said linear pattern portions of said second mark pattern constitute parts of a linear pattern element extended in said second direction.

13. A measuring method according to claim 11, wherein the corresponding pattern portions of said first and second mark patterns are arranged obliquely and substantially symmetrically with respect to a straight line in said second direction.

14. A measuring method according to claim 10, wherein said mask includes plural sets of mark patterns arranged in series in said first direction, each set including a said first mark pattern and a said second mark pattern.

15. A measuring method for an exposure apparatus which has a light source for emitting illumination light, an illumination optical system for illuminating a mask with said illumination light, a projection optical system for projecting an image of a pattern of the mask on a resist layer of a photosensitive substrate, a stage for holding said substrate and being movable along a first direction and a second direction substantially perpendicular to said first direction, said method comprising the steps of:

providing, as said mask, a mask having a first mark pattern including first and second linear pattern portions which are arranged obliquely and substantially symmetrically with respect to a straight line in said first direction and a third linear pattern portion arranged obliquely and substantially symmetrically with one of said first and second pattern portions with respect to a straight line in said second direction, and a second mark pattern including a first linear pattern portion extended in said first direction and a second linear pattern portion extended in said second direction;

projecting an image of said first mark pattern on said resist layer of said photosensitive substrate;

moving said stage in a predetermined manner and projecting an image of said second mark pattern on said resist layer of said photosensitive substrate so as to form a first pair of wedge-shaped resist images by overlapping parts of a resist image of said first and second pattern portions of said first mark pattern with parts of a resist image of said second pattern portion of said second mark pattern, and a second pair of wedge-shaped resist images by overlapping parts of a resist image of said second and third pattern portions of said first mark pattern with parts of a resist image of said first pattern portion of said second mark pattern;

measuring an interval in said second direction between said first pair of wedge-shaped resist images;

measuring an interval in said first direction between said second pair of wedge-shaped resist images; and determining amounts of positional deviation based on the measured intervals.

* * * * *